US006940762B2

(12) United States Patent
Umezawa

(10) Patent No.: US 6,940,762 B2
(45) Date of Patent: Sep. 6, 2005

(54) SEMICONDUCTOR MEMORY DEVICE INCLUDING MOS TRANSISTOR HAVING A FLOATING GATE AND A CONTROL GATE

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 10/751,430

(22) Filed: Jan. 6, 2004

(65) Prior Publication Data

US 2004/0252558 A1 Dec. 16, 2004

(30) Foreign Application Priority Data

Jun. 10, 2003 (JP) ........................................ 2003-165152

(51) Int. Cl.[7] ................................................ G11C 7/00
(52) U.S. Cl. .............................. 365/189.11; 365/230.06; 365/185.33
(58) Field of Search ....................... 365/189.11, 230.06, 365/185.33, 185.18, 189.09

(56) References Cited

U.S. PATENT DOCUMENTS

| 6,222,774 B1 | 4/2001 | Tanzawa et al. |
| 6,384,808 B2 | 5/2002 | Azami |
| 6,510,089 B2 * | 1/2003 | Taura et al. ........... 365/189.11 |

OTHER PUBLICATIONS

Toru Tanzawa, et al., "Circuit Technologies for a Single–1.8V Flash Memory", Symposium on VLSI Circuits Digest of Technical Papers, Jun. 1997, pp. 63–64.

Non–volatile Semiconductor Workshop 4.1, 1997, Wei–Hua Liu et al., "A2–Transistor Source–select (2TS) Flash EEPROM for 1.8V–Only Applications".

* cited by examiner

*Primary Examiner*—David Lam
(74) *Attorney, Agent, or Firm*—Oblon, Spivak, McClelland, Maier & Neustadt, P.C.

(57) ABSTRACT

A semiconductor memory device includes a column decoder and a first row decoder. The column decoder or first row decoder includes a level shift circuit having a second to fifth transistor and a first switch element. The second and third MOS transistors have source connected electrically to a power supply potential. The fourth MOS transistor has a gate receiving an input signal, drain connected to a drain of the second MOS transistor and to the gate of the third MOS transistor, and the source connected to the ground potential. The fifth MOS transistor has a gate receiving the inverted input signal, drain connected to a drain of the third MOS transistor, to the gate of the second MOS transistor and to a bit line or word line. The first switch element controls the supply of the power supply potential to the second and third MOS transistors.

11 Claims, 13 Drawing Sheets

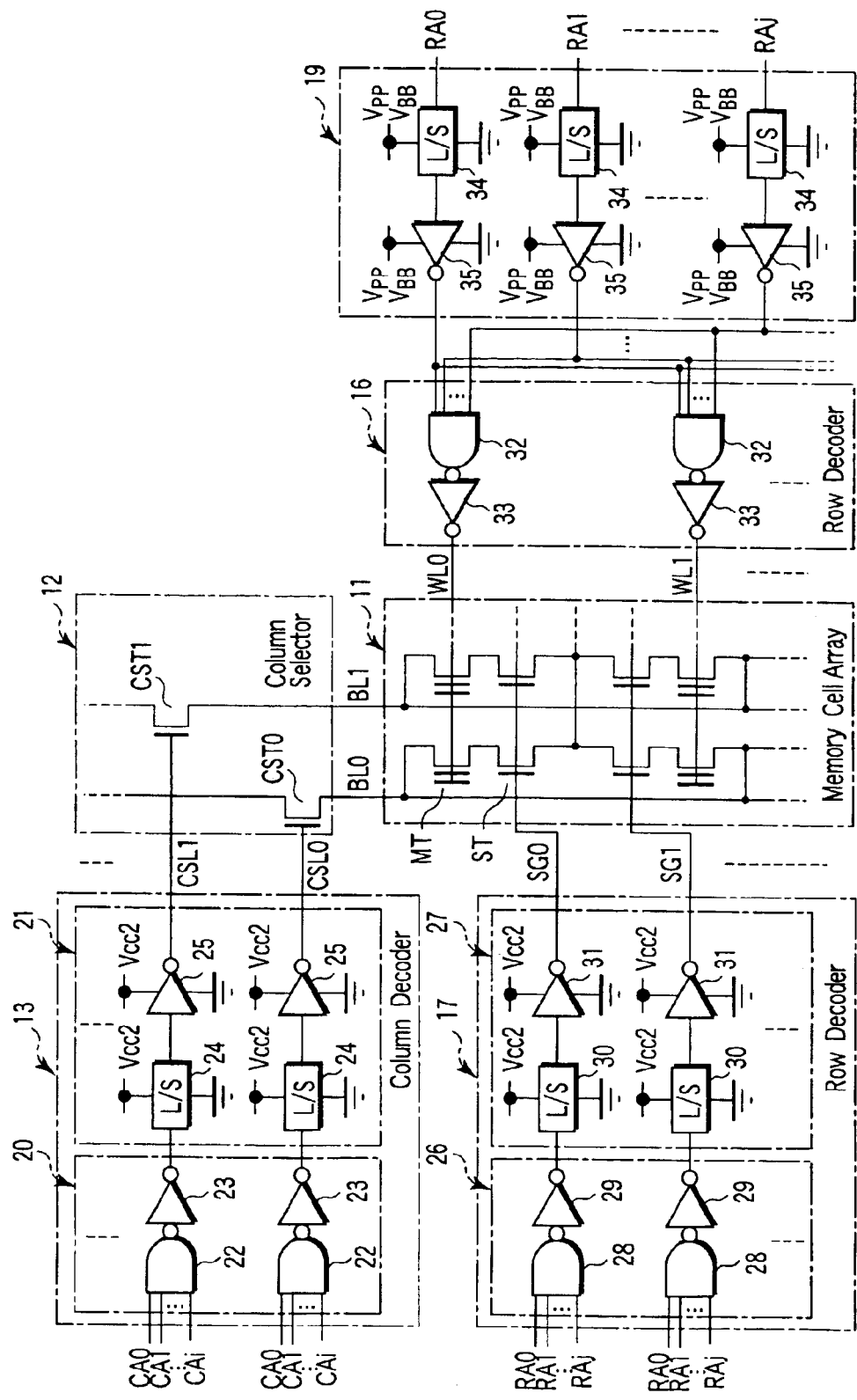
F I G. 2

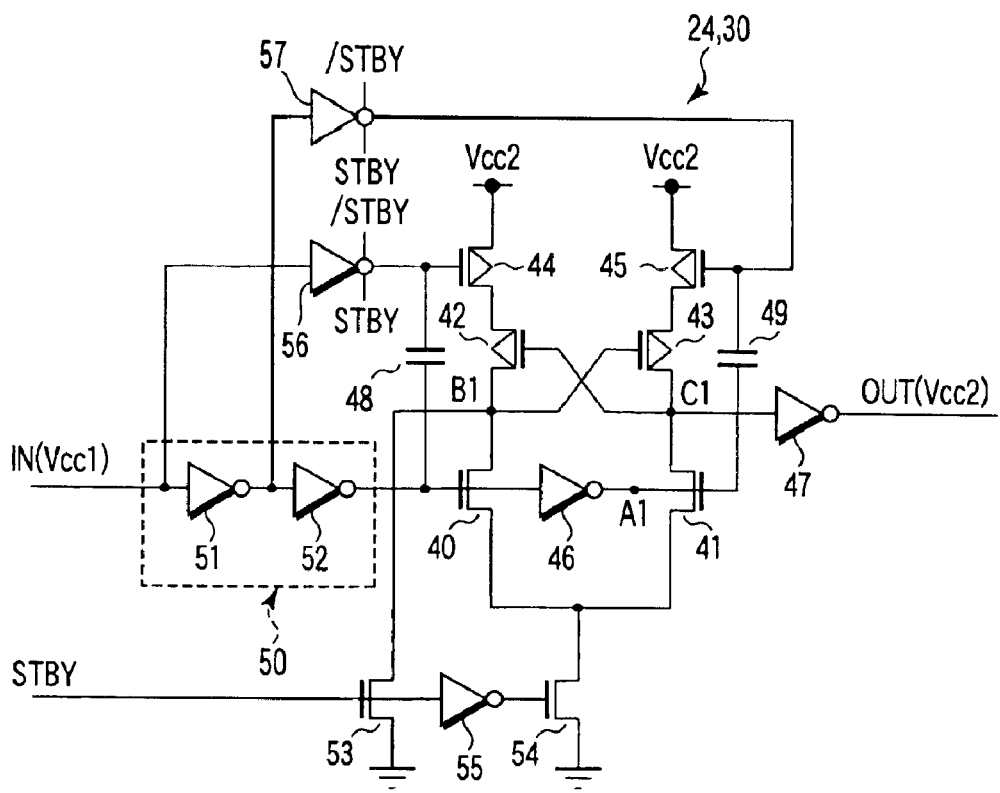
F I G. 11
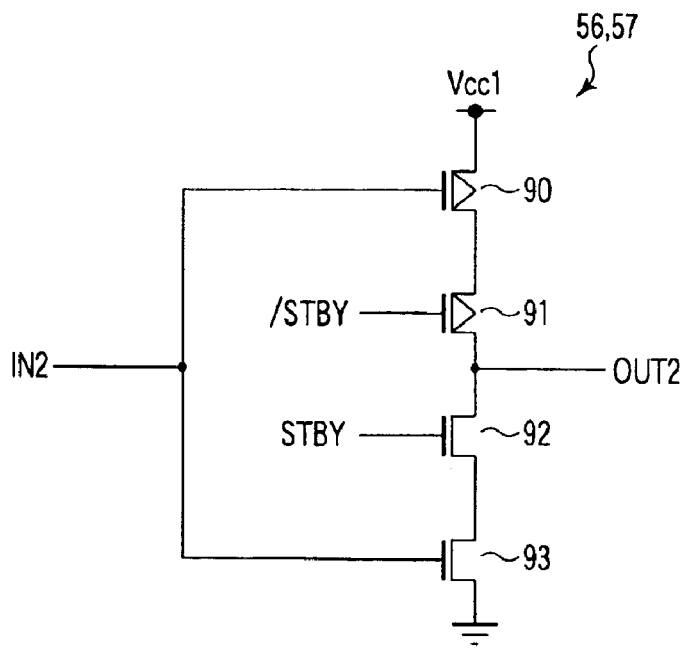
F I G. 12

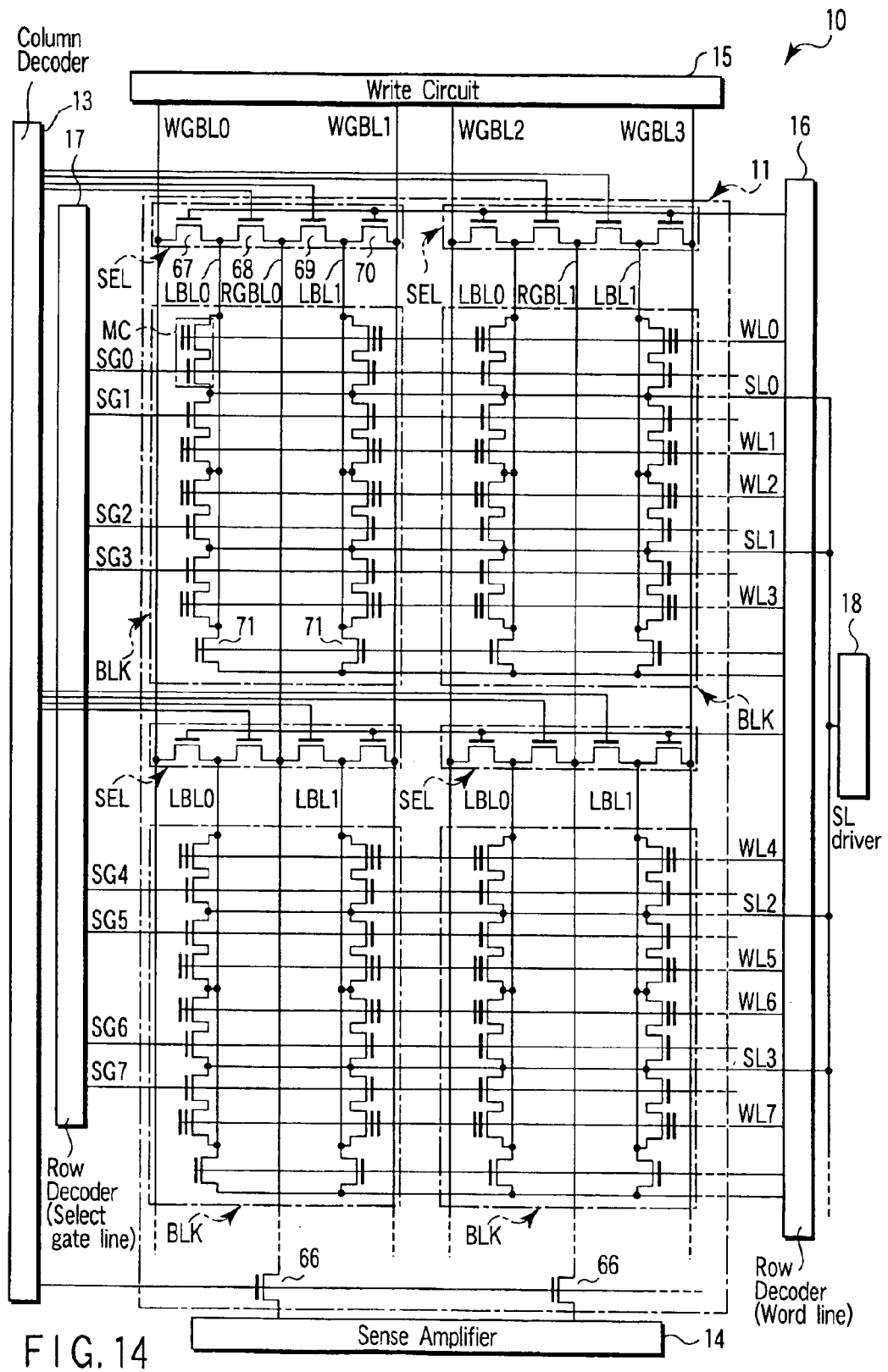
F I G. 14

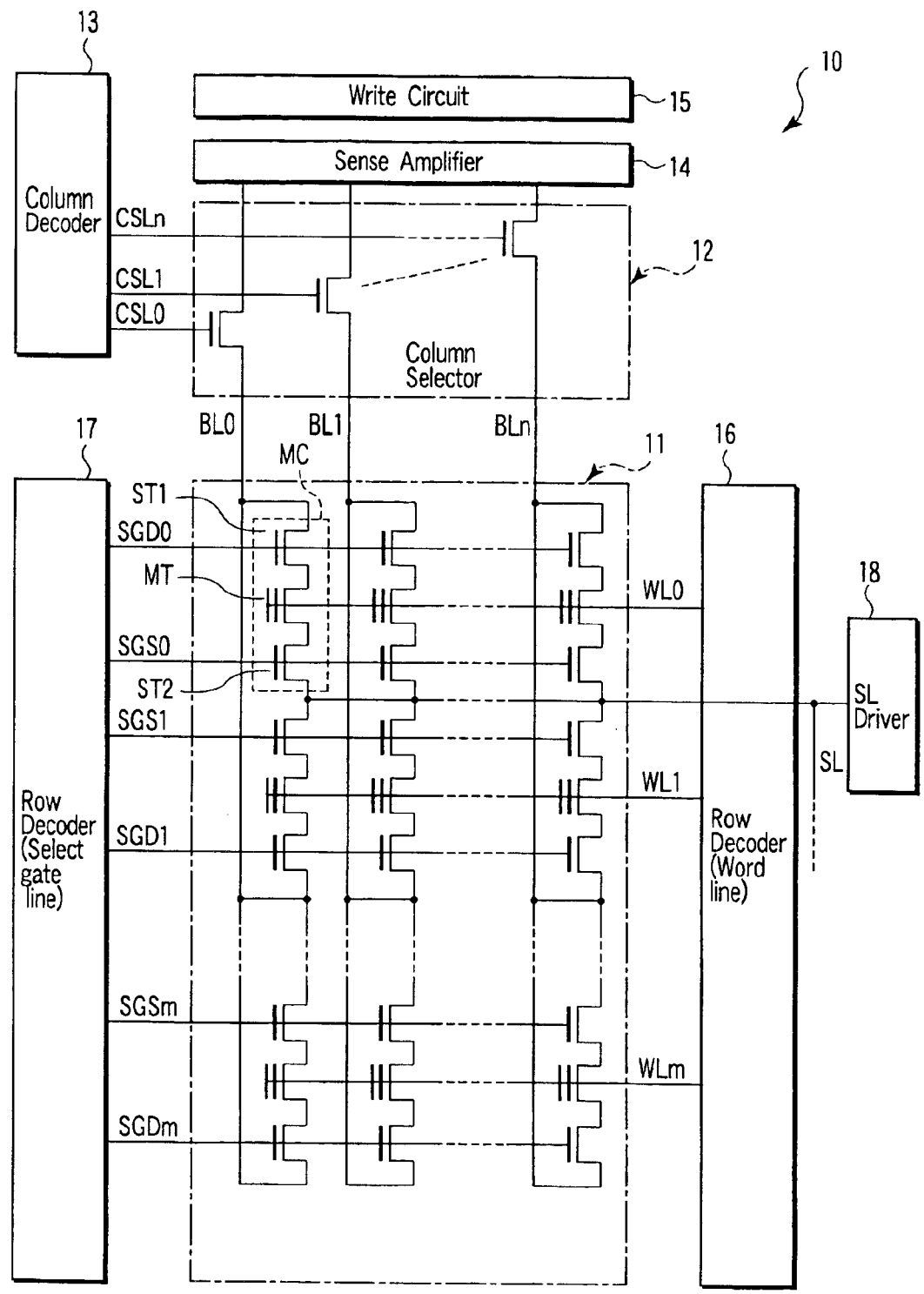
F I G. 16

SEMICONDUCTOR MEMORY DEVICE INCLUDING MOS TRANSISTOR HAVING A FLOATING GATE AND A CONTROL GATE

CROSS-REFERENCE TO RELATED APPLICATIONS

This application is based upon and claims the benefit of priority from the prior Japanese Patent Application No. 2003-165152, filed on Jun. 10, 2003, the entire contents of which are incorporated herein by reference.

BACKGROUND OF THE INVENTION

1. Field of the Invention

This invention relates to a semiconductor memory device. More particularly, this invention relates to, for example, a nonvolatile semiconductor memory device including MOS transistor having a floating gate and a control gate.

2. Description of the Related Art

Nonvolatile semiconductor memories, including NOR flash memories and NAND flash memories, have been widely used.

In recent years, a flash memory combining the best features of the NOR flash memory and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. This flash memory has memory cells, each including two MOS transistors. In such a memory cell, one MOS transistor functioning as a nonvolatile memory section has a structure including a control gate, and a floating gate and is connected to a bit line. The other MOS transistor, which is connected to a source line, is used to select a memory cell.

With the conventional flash memory, the address decode signal obtained by decoding the address signal is raised to a specific potential by a level shift circuit. Thereafter, the raised signal is supplied to a select gate line. Since the level shift circuit in the conventional flash memory has a low operating speed, the operating speed of the flash memory tends to be low.

BRIEF SUMMARY OF THE INVENTION

A semiconductor memory device according to an aspect of the present invention comprises:

a memory cell array which has memory cells arranged in a matrix, each memory cell having a first MOS transistor with a stacked gate including a first semiconductor layer and a second semiconductor layer formed on the first semiconductor layer with an inter-gate insulating film interposed therebetween;

bit lines each of which connects one end of the current path of each of the first MOS transistors in the same column in common electrically;

first word lines each of which connects the second semiconductor layers of the first MOS transistors in the same row in common;

a column selector which selects any one of the bit lines;

a column decoder which controls the column selector; and a first row decoder which selects any one of the first word lines, at least one of the column decoder and the first row decoder including a level shift circuit which includes:

a second and a third MOS transistor each of which has one end of its current path connected electrically to a power supply potential;

a fourth MOS transistor which has a gate receiving an input signal related to an address signal, one end of its current path connected to the other end of the current path of the second MOS transistor and to the gate of the third MOS transistor, and the other end of its current path connected electrically to the ground potential;

a fifth MOS transistor which has a gate receiving the inverted signal of the input signal, one end of its current path connected to the other end of the current path of the third MOS transistor, to the gate of the second MOS transistor and to the bit line or the first word line electrically, and the other end of its current path connected electrically to the ground potential; and a first switch element which controls the supply of the power supply potential to the second and third MOS transistors in response to the input signal.

BRIEF DESCRIPTION OF THE SEVERAL VIEWS OF THE DRAWING

FIG. 2 is a circuit diagram of a part of the flash memory according to the first embodiment;

FIG. 11 is a circuit diagram of a level shift circuit provided in a flash memory according to a second modification of the third embodiment;

FIG. 12 is a circuit diagram of a clocked inverter;

FIGS. 14 to 17 are block diagrams of a flash memory according to a second to a fifth modification of each of the first to third embodiments;

DETAILED DESCRIPTION OF THE INVENTION

Figure 1:
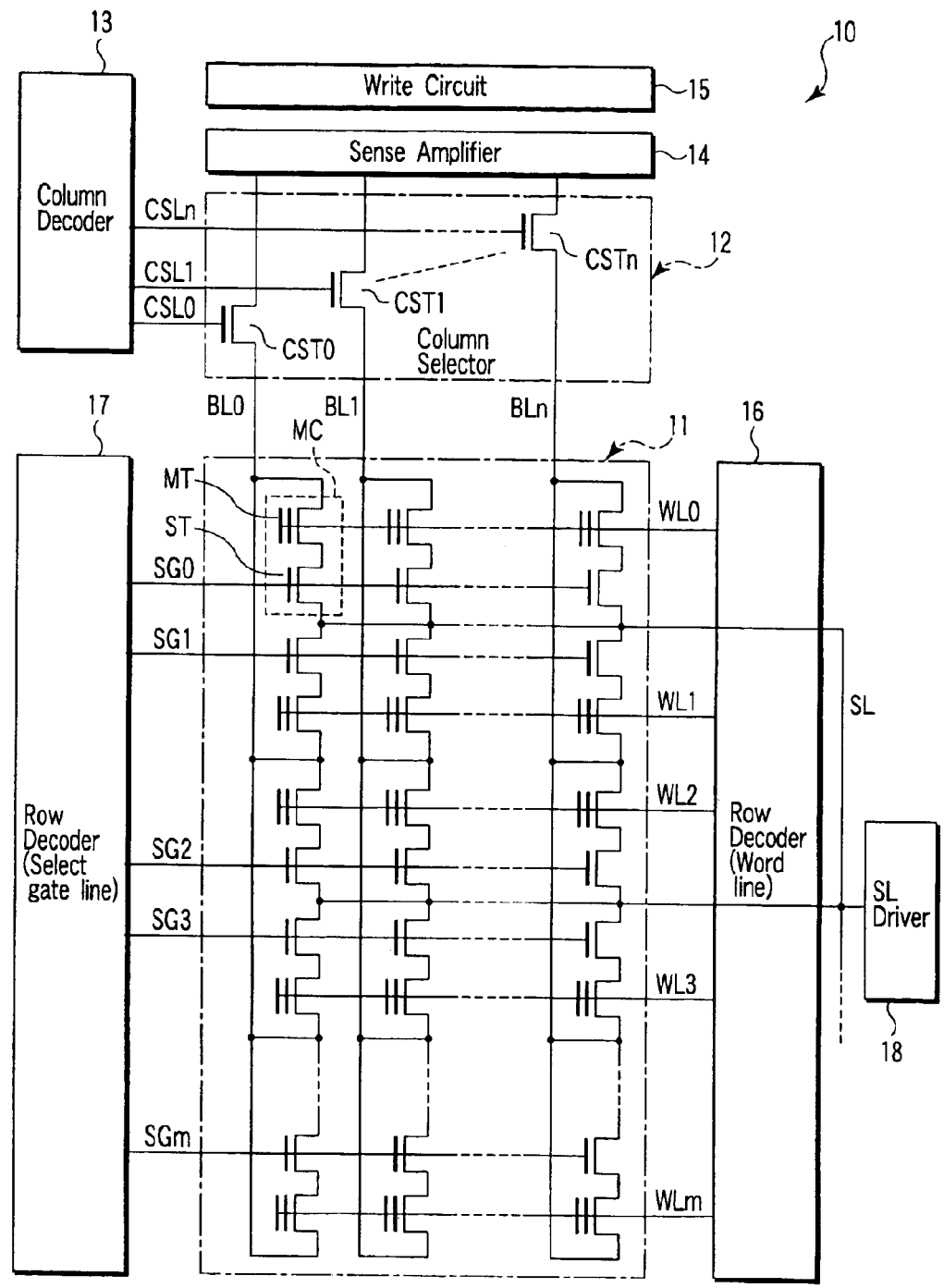
FIG. 1 is a block diagram of a flash memory according to a first embodiment of the present invention.

A semiconductor memory device according to a first embodiment of the present invention will be explained by reference to FIG. 1. FIG. 1 is a block diagram of a flash memory according to the first embodiment.

As shown in FIG. 1, a flash memory 10 comprises a memory cell array 11, a column selector 12, a column decoder 13, a sense amplifier 14, a write circuit 15, a first row decoder 16, a second row decoder 17, and a source line driver 18.

The memory cell array 11 has (m+1)×(n+1) memory cells MC (where m and n are natural numbers) arranged in a matrix. Each of the memory cells MC has a memory cell transistor MT and a select transistor ST whose current paths are connected in series with each other. The memory cell transistor MT has a stacked gate structure that has a floating gate formed on a semiconductor substrate with a gate insulating film interposed therebetween and a control gate formed on the floating gate with an inter-gate insulating film interposed therebetween. The floating gates are separated from one another so as to correspond to the individual memory cell transistors MT. Like the memory cell transistors MT, the select transistors ST each have a stacked gate structure that has a floating gate and a control gate formed on the floating gate with an inter-gate insulating film interposed therebetween. However, the select transistors ST differ from the memory cell transistors MT in that the floating gates of the select transistors ST in the same row are connected in common and further connected electrically to the control gate. The source region of the memory cell transistor MT is connected to the drain region of the select transistor ST. Memory cells MC adjoining in the column direction share the source region of the select transistor ST or the drain region of the memory cell transistor MT.

The control gates of the memory cell transistors MT of the memory cells MC in the same row are connected commonly to any one of word lines WL0 to WLm. The control gates of the select transistors ST of the memory cells in the same row are connected commonly to any one of select gate lines SG0 to SGm. The drains of the memory cell transistors MT of the memory cells MC in the same column are connected commonly to any one of bit lines BL0 to BLn. The sources of the select transistors ST of the memory cells MC are connected commonly to a source line SL, which is connected to a source line driver 18.

The column decoder 12 includes (N+1) column select transistors CST0 to CSTn. One end of the current path of each of the column select transistors CST0 to CSTn is connected to a corresponding one of bit lines BL0 to BLn. The other ends of the current paths of the column select transistors CST0 to CSTn are connected to the sense amplifier 14 and write circuit 15. The gates of the column select transistors CST0 to CSTn are connected to the column select lines CSL0 to CSLn, respectively.

The column decoder 13 decodes a column address signal, thereby producing a column address decode signal. Then, on the basis of the column address decode signal, the column decoder 12 selects any one of the column select lines CSL0 to CSLn.

The first and second row decoders 16, 17 decode a row address signal, thereby producing a row address decode signal. Then, the first row decoder 16 selects any one of the word lines WL0 to WLm in a write operation. The second row decoder 17 selects any one of the select gate lines SG0 to SGm in a read operation.

The sense amplifier 14 amplifies the data read from the memory cell MC selected by the second row decoder 17, column decoder 13, and column selector 12.

The write circuit 15 holds the write data externally input and supplies a voltage corresponding to the write data to a bit line.

The source line driver 18 supplies a voltage to the source line SL in a read operation.

Next, the configuration of the column decoder 13 and the first and second row decoders 16, 17 will be explained by reference to FIG. 2. FIG. 2 is a circuit diagram of these decoders.

The configuration of the column decoder 13 will be explained. The column decoder 13 includes a column address decode circuit 20 and a voltage converting circuit 21. The column address decode circuit 20, which operates on a power supply voltage Vcc1 (=1.35 to 1.65V), decodes (i+1)-bit column address signal CA0 to CAi, thereby producing a column address decode signal. The column address decode circuit 20 has a NAND circuit 22 and an inverter 23 provided for each of the column select lines CSL0 to CSLn. The NAND circuit 22 performs NAND operation on each bit CA0 to CAi in the column address signal. Then, the inverter 23 inverts the result of the NAND operation, thereby outputting the inverted signal as a column address decode signal.

The voltage converting circuit 21, which operates on a power supply voltage Vcc2 (=2.7 to 3.6V), converts a column address decode signal of a Vcc1 level into that of a Vcc2 level. The voltage converting circuit 21 includes a level shift circuit 24 and an inverter 25 provided for each of the column select lines CSL0 to CSLn. The level shift circuit 24 converts the voltage level of the column address decode signal into the Vcc2 level. The inverter 25 inverts the output of the level shift circuit 24. The output of the inverter 25 is supplied to the column select lines CSL0 to CSLn as a column select signal.

Next, the configuration of the second row decoder 17 will be explained. The configuration of the second row decoder is almost the same as that of the column decoder 13. Specifically, the second row decoder 17 includes a row address decode circuit 26 and a voltage converting circuit 27. The row address decode circuit 26, which operates on the power supply voltage Vcc1 (=1.35 to 1.65V), decodes (j+1)-bit row address signals RA0 to RAj, thereby producing a row address decode signal. The row address decode circuit 26 has a NAND circuit 28 and an inverter 29 provided for each of the select gate lines SG0 to SGm. The NAND circuit 28 performs NAND operation on each bit RA0 to RAj in the row address signal. Then, the inverter 29 inverts the result of the NAND operation, thereby outputting the inverted signal as a row address decode signal.

The voltage converting circuit 27, which operates on the power supply voltage Vcc2 (=2.7 to 3.6V), converts a row address decode signal of the Vcc1 level into that of the Vcc2 level. The voltage converting circuit 27 includes a level shift circuit 30 and an inverter 31 provided for each of the select gate lines SG0 to SGm. The level shift circuit 30 converts the voltage level of the row address decode signal into the Vcc2 level. The inverter 31 inverts the output of the level shift circuit 30. The output of the inverter 31 is supplied to the select gate lines SG0 to SGn.

Next, the configuration of the first row decoder 16 will be explained. The configuration of the first row decoder 16 is almost the same as that of each of the column address decode circuit 20 and row address decode circuit 26. The first row address decode circuit 16, which operates on power supply voltages VPP (=10V) and VBB (=−6V), decodes (j+1)-bit row address signals RA0 to RAj, thereby producing a row address decode signal. The row address decode signal is supplied to the word lines WL0 to WLm. The first row decoder 16 has a NAND circuit 32 and an inverter 33 provided for each of the word lines WL0 to WLm. The NAND circuit 32 performs NAND operation on each bit RA0 to RAj in the row address signal. Then, the inverter 33 inverts the result of the NAND operation, thereby outputting the inverted signal as a row address decode signal.

The potential of the row address signal input to the first row decoder 16 is changed from the Vcc1 level to the Vpp level or VBB level. It is the voltage converting circuit 19 that converts the potentials of the row address signals RA0 to RAj. The voltage converting circuit 19, which operates on the power supply voltage Vpp or VBB, converts the row address signals RA0 to RAj of the Vcc1 level into those of the Vpp level or VBB level. The voltage converting circuit 19 has a level shift circuit 34 and an inverter 35 provided for each bit RA0 to RAj in the row address signal. The level shift circuit 34 converts the voltage level of the row address signal into the Vpp level or VBB level. The inverter 35 inverts the output of the level shift circuit 30. The output of the inverter 35 is then supplied to the first row decoder 16.

Specifically, the column decoder 13 and second row decoder 17 first decode the column address signal and the row address signal, respectively. Thereafter, the column decoder 13 and second row decoder 17 changes the voltage levels of the column address decode signal and row address signal from the Vcc level to the Vcc2 level. On the other hand, the first row decoder 16 first changes the voltage level of the row address signal from the Vcc1 level to the Vpp or VBB level. Thereafter, the first row decoder 16 decodes the row address signal of the Vpp or VBB level to obtain a row address decode signal.

Figure 3:
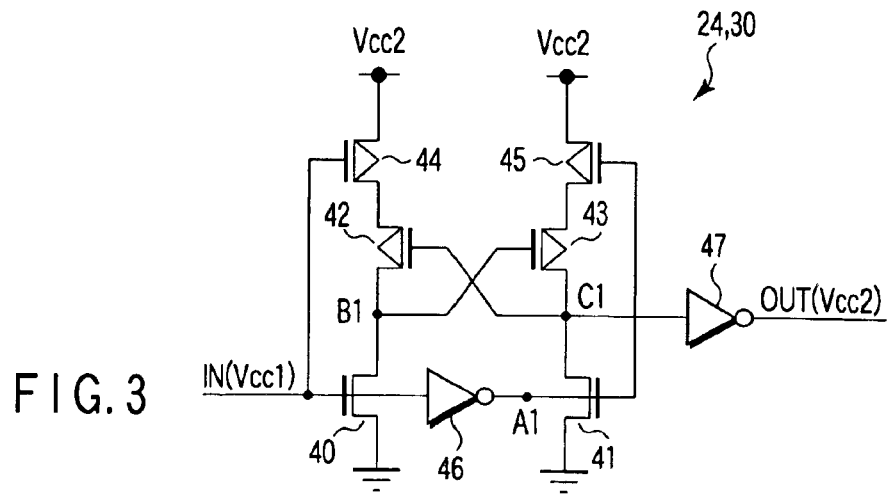
FIG. 3 is a circuit diagram of a level shift circuit provided in the flash memory of the first embodiment.

Next, the configuration of the level shift circuits 24, 30 included in the voltage converting circuit 21, 27 will be explained by reference to FIG. 3. FIG. 3 is a circuit diagram of the level shift circuit 24 or 30.

As shown in FIG. 3, the level shift circuit 24 or 30 includes two n-channel MOS transistors 40, 41, four p-channel transistors 42 to 45, and two inverters 46, 47. The n-channel MOS transistor 40 has its source grounded and its drain connected to node B1. An input signal IN is input to the gate of the n-channel MOS transistor 40. The input signal IN is the column address decode signal or row address decode signal of the Vcc1 level obtained at the column address decode circuit 20 or row address decode circuit 26. The n-channel MOS transistor 41 has its source grounded and its drain connected to node C1. An input signal /IN inverted by the inverter 46 is input to the gate of the n-channel MOS transistor 41. The p-channel MOS transistor 42 has its drain connected to node B1 and its gate connected to node C1. The p-channel MOS transistor 43 has its drain connected to node C1 and its gate connected to node B1. The p-channel MOS transistor 44 has its source connected to the power supply potential Vcc2 and its drain connected to the source of the p-channel MOS transistor 42. The input signal IN is input to the gate of the p-channel MOS transistor 44. The p-channel MOS transistor 45 has its source connected to the power supply voltage Vcc2 and its drain connected to the source of the p-channel MOS transistor 43. The inverted input signal /IN is input to the gate of the p-channel MOS transistor 45. The signal at node C1 is inverted by the inverter 47, which outputs the inverted signal as an output signal OUT.

Figure 4:
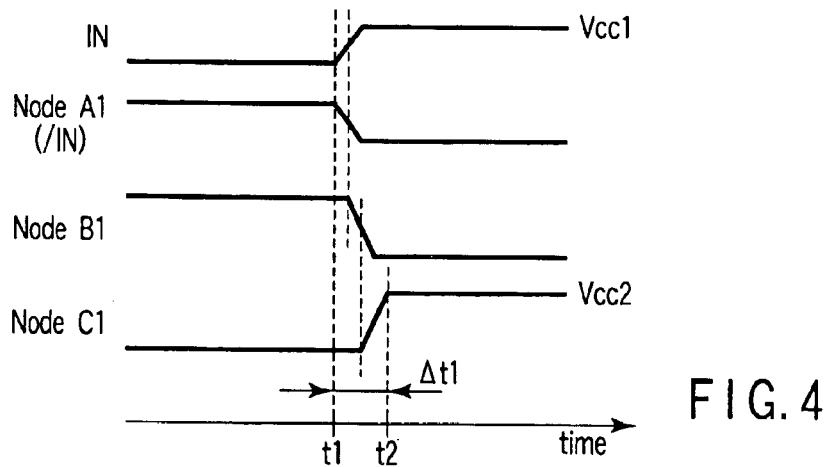
FIG. 4 is a timing chart for various signals in the level shift signal of FIG. 3.

Next, the operation of the level shift circuit configured as described above will be explained by reference to FIG. 4, taking as an example the level shift circuit 30 corresponding to select gate line SG0 in the second row decoder 17. FIG. 4 is a timing chart for input signal IN (row address decode signal) and the potentials of the signals at node A1 (inverted input signal /IN), node B1, and node C1.

Suppose the row address signal (RA0 to Raj) is externally is input to the select gate line SG0 in a read operation. Then, the row address decode signal goes to the high level (Vcc1) (at time t1). At the same time, the inverted input signal /IN (the potential at node A1) goes to the low level. As a result, the n-channel MOS transistor 40 turns on and the n-channel MOS transistor 41 turns off. At the same time, the p-channel MOS transistor 44 turns off and the p-channel MOS transistor 45 turns almost on. The p-channel MOS transistor 45 operates on the Vcc2 level. Since the inverted input signal /IN is a signal of the Vcc level lower than the Vcc2 level, the p-channel MOS transistor 45 is not fully on. As a result, the potential at node B1 goes to the low level (or ground potential). The potential at node B1 going low causes the p-channel MOS transistor 43 to turn on. As a result, node C1 goes to the high level (Vcc2) (at time t2). That is, the potential of the row address decode signal (input signal IN) is changed from Vcc1 to Vcc2. Then, the potential at node C1 is inverted at the inverters 47, 31. The inverted potential is applied to select gate line SG0.

The operation of the level shift circuit 24 in the column decoder 13 is the same as that of the second row decoder 17 except that the row address decode signal is replaced with the column address decode signal. The level shift circuit 34 in the voltage converting circuit 19 may have the same configuration as that of FIG. 3 and carry out the same operation.

Next, the operation of the flash memory configured as described above will be explained.

<Write Operation>

In a write operation, "0" data or "1" data is written, depending on whether electrons are injected into the floating gate of a memory cell transistor MT. Electrons are injected into the floating gate by Fowler-Nordheim (FN) tunneling.

Hereinafter, a write operation will be explained in detail by reference to FIG. 1.

In FIG. 1, write data ("1" or "0") is input from the I/O terminal (not shown). Then, the write data is input to the write circuit 15. When the data to be written is "1", the write circuit 15 applies 0V to the bit line. Conversely, when the data to be written is "0", the write circuit 15 applies VBB (−6V) to the bit line.

According to the column address signal CA0 to CAi, the column decoder 13 selects any one of the column select lines CSL0 to CSLn. Then, the column decoder 13 applies Vcc2 to the selected column select line. As a result, the bit lines BL0 to BLn are connected to the write circuit 15.

Then, according to the row address signal RA0 to RAj, the first row decoder 16 selects any one of the word lines WL0 to WLm and then applies Vpp (e.g., 10V) to the selected word line. The second row decoder 17 applies the low-level signal to the select gate lines SG0 to SGm. Thus, all of the select transistors ST are turned off. As a result, the select transistors ST are electrically disconnected from the source line SL. The substrate of the memory cells is also set at VBB (−6V).

As a result, a potential corresponding to "1" data or "0" data is applied to the drain regions of the memory cell transistors MT via the bit lines BL0 to BLn. Then, Vpp (10V) is applied to the selected word line WL, 0V is applied to the drain regions of the memory cell transistors MT into which "1" data is to be written, and VBB (−6V) is applied to the drain regions of the memory cell transistors MT into which "0" data is to be written. Thus, since the potential difference (10V) between the gate and drain of a memory cell transistor MT into which "1" data is to be written is not sufficient, electrons are not injected into the floating gate, with the result that the memory cell transistor MT holds the negative threshold value. On the other hand, since the potential difference (16V) between the gate and drain of a memory cell transistor MT into which "0" data is to be written is large, electrons are injected into the floating gate by FN tunneling. As a result, the threshold value of the memory cell transistor MT becomes positive.

<Read Operation>

The details of a read operation will be explained by reference to FIG. 1.

In FIG. 1, the second row decoder 17 selects any one of the select gate lines SG0 to SGm according to the row address signal RA0 to RAj. A high level (e.g., Vcc2) is applied to the selected select gate line. A low level (e.g., 0V) is applied to all of the unselected select gate lines. Thus, the select transistor ST connected to the selected select gate line is turned on, whereas the select transistors ST connected to the unselected select gate lines are turned off. Thus, the select transistor ST in the selected memory cell is connected electrically to the source line SL. In addition, the first row decoder 16 places all the word lines WL0 to WLm at the low level (0V). The source line driver 18 sets the potential of the source line SL at 0V.

The column decoder 13 selects any one of the column select lines CSL0 to CSLn according to the column address signal CA0 to CAi. Then, the column decoder 13 applies Vcc2 to the selected column select line. As a result, the bit lines BL0 to BLn are connected to the sense amplifier 14.

Then, for example, a voltage of about 1V is applied to the bit lines BL0 to BLn. Since the memory cell transistor MT of a memory cell MC into which "1" data has been written has a negative threshold voltage, it is in the on state. Thus, in the memory cell MC connected to the selected select gate line, current flows from the bit line to the source line SL via the current paths of the memory cell transistor MT and select transistor ST. On the other hand, since the memory cell transistor MT of a memory cell MC into which "0" data has been written has a positive threshold voltage, it is in the off state. Thus, no current flows from the bit line to the source line.

As a result, the potentials of the bit lines BL0 to BLn vary. The sense amplifier 70 amplifies the variations, thereby carrying out the read operation.

<Erase Operation>

The data is erased simultaneously from all the memory cells sharing a well region. Thus, in the example of FIG. 1, all the memory cells included in the memory cell array 11 are erased at the same time.

In FIG. 1, the first row decoder 16 applies VBB (−6V) to all the word lines WL0 to WLm. The potential of the semiconductor substrate (well region) is set at Vpp (10V). As a result, electrons are extracted from the floating gates of the memory cell transistors of the memory cells MC into the semiconductor substrate by FN tunneling. As a result, the threshold voltages of all the memory cells MC become negative, thereby erasing the data.

The operations of the level shift circuits 24, 30, 34 when the decoders 13, 16, 17 select the column select lines CSL0 to CSLn, word lines WL0 to WLm, and select gate lines SGS0 to SGSm are as explained in FIGS. 3 and 4.

As described above, the flash memory according to the first embodiment produces the following effect.

(1) The operating speed of the flash memory is improved.

As shown in FIG. 3, each of the level shift circuits 24, 30, 34 in the flash memory according to the first embodiment has p-channel MOS transistors 44, 45. When the row address decode signal or column address decode signal goes high, the p-channel MOS transistor 44 turns off and the p-channel MOS transistor 45 turns on. As a result, the p-channel MOS transistor 42 is disconnected from the power supply potential Vcc2, which shortens the time (Δt1) required to convert the row address decode signal or column address decode signal of the Vcc1 level into that of the Vcc2 level. Consequently, the operating speed of the flash memory is improved.

Figure 5:
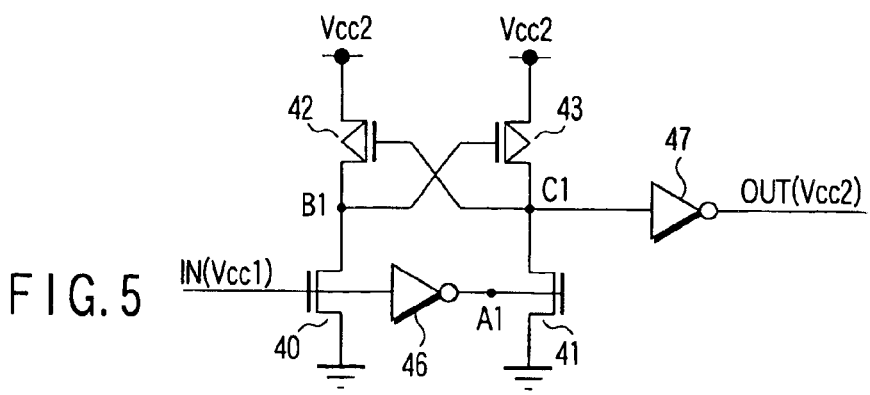
FIG. 5 is a circuit diagram of the level shift circuit.
Figure 6:
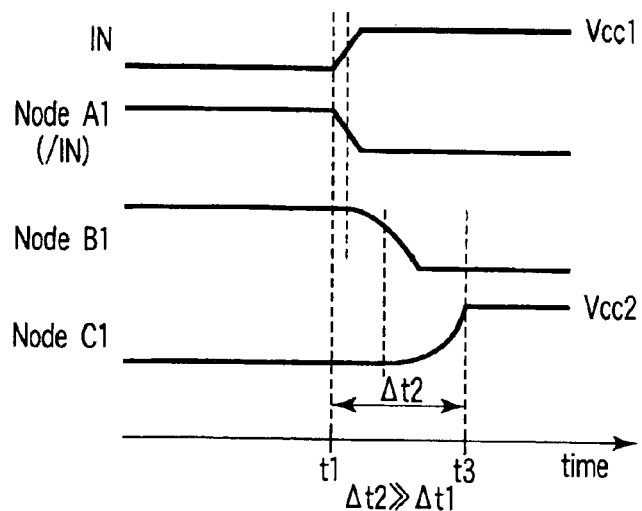
FIG. 6 is a timing chart for various signals in the level shift signal of FIG. 5.

This will be explained by comparison with a level shift circuit shown in FIG. 5. FIG. 5 is a circuit diagram of a level shift circuit obtained by eliminating the p-channel MOS transistors 44, 45 in the configuration of FIG. 3. Specifically, the sources of the p-channel MOS transistors 42, 43 are connected directly to the power supply potential Vcc2. The operation of the level shift circuit configured as described above will be explained by reference to FIG. 6. FIG. 6 is a timing chart for the input signal IN (the row address decode signal or column address decode signal) and the potentials of the signals at node A2 (inverted input signal /IN), node B2, and node C2.

As shown in FIG. 6, suppose the row address decode signal or column address decode signal goes high at time t1. Then, the inverted input signal /IN (potential at node A1) goes low. What is a problem here is the potential at node B1. Since the input signal IN is at the low level before time t1, the n-channel MOS transistor 41 is on and the p-channel MOS transistor 42 is on before time t1. As a result, the potential at node B1 is at the high level (Vcc2).

Because the potential at node A1 goes low at time t1, the n-channel MOS transistor 41 goes off. Then, at the moment the n-channel MOS transistor 41 turns off, node C1 is in the floating state at low level. Accordingly, after time t1, too, the p-channel MOS transistor 42 remains in the on state, causing the drain current to flow. On the other hand, when the input signal IN goes high, the n-channel MOS transistor 40 turns on. As a result, the n-channel MOS transistor 40 starts to cause the drain current to flow. Specifically, the p-channel MOS transistor 42 attempts to cause the potential at node B1 to remain at Vcc2, whereas the n-channel MOS transistor 40 attempts to bring the potential at node B1 to the ground potential. As a result, the potential at node B1 starts to drop gradually from the high level (Vcc2). That is, the gate potential of the p-channel MOS transistor 43 starts to drop. Thus, the p-channel MOS transistor 43 goes gradually into the on state. Then, the potential at node C1 starts to rise toward Vcc2, with the result that the p-channel MOS transistor 42 starts to change to the off state. When the p-channel MOS transistor 42 starts to change to the off state, the potential at node B1 is getting closer to the ground potential. Then, the potential at node B1 eventually reaches the ground potential, which causes the p-channel MOS transistor 43 to turn on. In addition, the potential at node C1 reaches Vcc2, which causes the p-channel MOS transistor 42 to turn off.

As described above, with the configuration of FIG. 5, it take a very long time to change the potential of the row address decode signal or column address decode signal from the Vcc1 level to the Vcc2 level (Δt2>>Δt1). The reason for this is that a long time elapses from when the row address decode signal or column address decode signal goes high until the potential at node B1 is determined. This is due to the fact that the p-channel MOS transistor 42 remains in the on state even after the row address decode signal or column address decode signal goes high. Specifically, even when the n-channel MOS transistor 40 has turned on, the potential at node B1 cannot be set at the ground potential immediately, because the p-channel MOS transistor 42 is in the on state. As the p-channel MOS transistor 42 gets closer to the off state, the potential at node B1 gets closer to the ground potential gradually. Accordingly, it takes time for the p-channel MOS transistor 43 to be brought into the on state completely. Since the potential at node C1 depends on the state of the p-channel MOS transistor 43, it takes a long time (Δt2) for the potential at node C1 to be determined.

In contrast, with the configuration of the first embodiment, the p-channel MOS transistor 44 is connected between the source of the p-channel MOS transistor 42 and the power supply potential and the p-channel MOS transistor 45 is connected between the source of the p-channel MOS transistor 43 and the power supply potential. The input signal IN is input to the gate of the p-channel MOS transistor 44. The inverted input signal /IN is input to the gate of the p-channel MOS transistor 45. When the row address decode signal or column address signal goes high, this causes the n-channel MOS transistor 40 to turn on and the n-channel MOS transistor 41 to turn off. At the same time, the p-channel MOS transistor 44 is turned off and the p-channel MOS transistor 45 is turned on. Thus, at the moment the row address decode signal or column address signal goes high, the p-channel MOS transistor 42 prevents the drain current from flowing, although node C1 is at the low level. The reason is that the source of the p-channel MOS transistor 40 is disconnected from the power supply potential because the p-channel MOS transistor 44 is off. Thus, node B1 depends only on the n-channel MOS transistor 40 and is unaffected by the p-channel MOS transistor 42. As a result, node B1 goes to the low level (ground potential) quickly. The quick change of node B1 to the low level causes the p-channel MOS transistor 43 also to change to the on state quickly. Then, because the p-channel MOS transistor 45 is in the on state, the potential of node C1 changes to the high level (Vcc2) quickly.

As a result, the time required to convert the Vcc1 level of the row address decode signal or column address signal into the Vcc2 level can be shortened. Therefore, in a read and a write operation, the operation of selecting a word line, a select gate line, and a column select line is made faster, which improves the operating speed of the flash memory.

Figure 7:
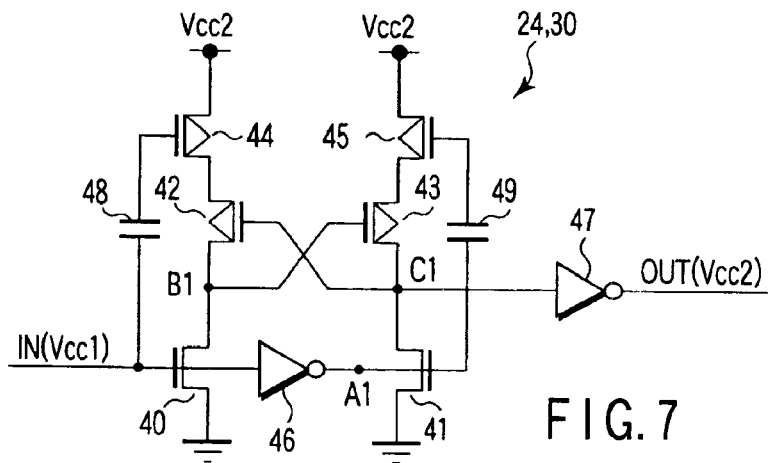
FIG. 7 is a circuit diagram of a level shift circuit provided in a flash memory according to a second embodiment of the present invention.

Next, a semiconductor memory device according to a second embodiment of the present invention will be explained. The second embodiment is such that the gate potentials of the p-channel MOS transistors 44, 45 in the level shift circuit are controlled by the coupling of capacitor elements in the first embodiment. Accordingly, the configuration excluding the level shift circuit is the same as that of the fist embodiment, so its explanation will be omitted. FIG. 7 is a circuit diagram of each of the level shift circuits 24, 30 provided in a flash memory according to the second embodiment.

As shown in the figure, each of the level shift circuits 24, 30 of the second embodiment is such that two capacitor elements 48, 49 are provided in the configuration of FIG. 3 explained in the first embodiment. One electrode of the capacitor element 48 is connected to the gate of the p-channel MOS transistor 44 and the input signal IN is input to the other electrode of the capacitor element 48. One electrode of the capacitor element 49 is connected to the gate of the p-channel MOS transistor 45 and the inverted input signal /IN is input to the other electrode of the capacitor element 49.

The operation of the level shift circuit configured as described above is the same as that of the first embodiment except that the gate potentials of the p-channel MOS transistors 44, 45 are controlled by the coupling of the capacitor elements 48, 49, respectively. When the row address decode signal or column decode signal goes high, this causes the gate potential of the p-channel MOS transistor 44 to rise through the coupling of the capacitor element 48 and the gate potential of the p-channel MOS transistor 45 to drop through the coupling of the capacitor element 49. As a result, the p-channel MOS transistor 44 turns off and the p-channel MOS transistor 45 turns on.

The level shift circuit 34 in the voltage converting circuit 19 may has the same configuration as that of FIG. 7 and carry out the same operation.

The second embodiment with the above configuration also produces the effect in item (1) explained in the first embodiment.

Figure 8:
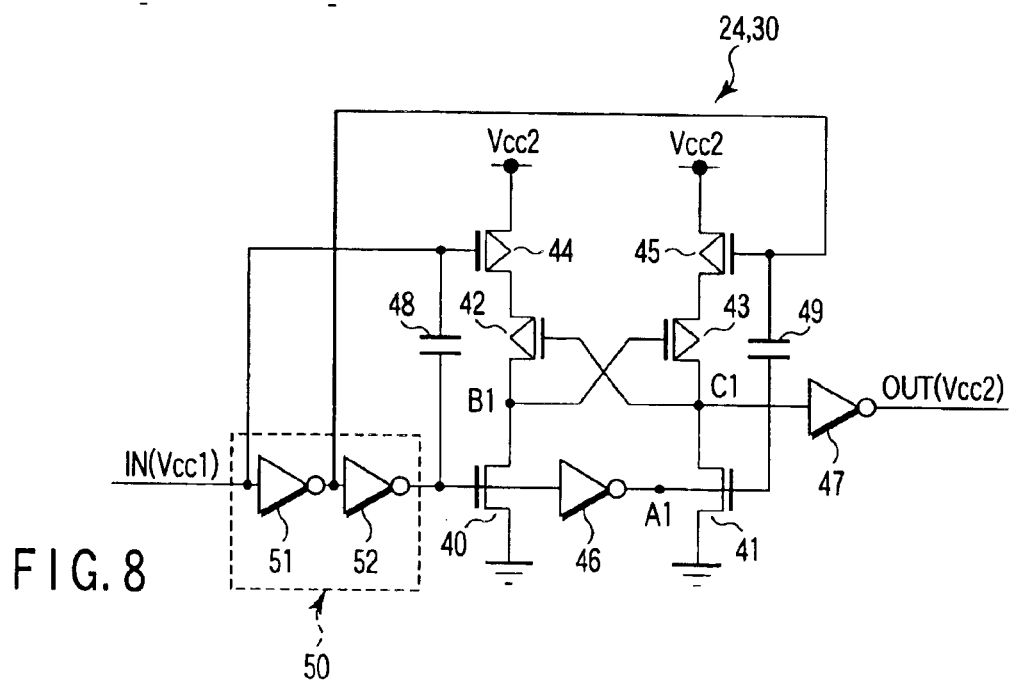
FIG. 8 is a circuit diagram of a level shift circuit provided in a flash memory according to a modification of the second embodiment.

FIG. 8 is a circuit diagram of a level shift circuit according to a modification of the second embodiment. With the circuit configuration of FIG. 7, the gate potentials of the p-channel MOS transistors 44, 45 are in the floating state. Thus, it is desirable that the potentials of the p-channel MOS transistors 44, 45 should be stabilized by providing a charging circuit as shown in FIG. 8. As shown in the figure, the charging circuit includes a delay circuit 50 and metal wires. The delay circuit 50 has two inverters 51, 52 connected in series. The input signal IN is input to the input node of the inverter 51. The output of the inverter 52 is input to the gate of the n-channel MOS transistor 40 and to the inverter 46. A metal wire connects the input node of the inverter 51 to the gate of the p-channel MOS transistor 44. Another metal wire connects the input node of the inverter 52 to the gate of the p-channel MOS transistor 45.

The configuration of the modification produces not only the effect in item (1) but also the effect in the following item (2).

(2) The level shift circuit is protected effectively from destruction.

When the capacitor elements 44, 45 are not used, the gate potentials of the p-channel MOS transistors 44, 45 are in the floating state. If the potential of the p-channel MOS transistor 44 is at a high potential, such as Vcc2, for some reason, when the input signal IN goes to the high level, the gate potential of the p-channel MOS transistor 44 becomes as high as Vcc2+Vcc1. As a result, the p-channel MOS transistor 44 can be destroyed.

In this modification, the input signal IN reaches the gate of the p-channel MOS transistor 44 a delay time generated at the delay circuit 50 earlier than reaching the other electrode of the capacitor element 48. That is, at the moment the gate potential of the p-channel MOS transistor 44 changes through the coupling of the capacitor element 48, the gate potential of the p-channel MOS transistor 44 has already been set at Vcc1.

Accordingly, even when the gate potential of the p-channel MOS transistor 44 rises through the coupling of the capacitor element 48, its potential is always constant at Vcc1+Vcc1. Thus, the MOS transistor 44 is protected from destruction. The same holds true for the p-channel MOS transistor 45. This modification may be, of course, applied to the level shift circuit 34 in the voltage converting circuit 19.

Figure 9:
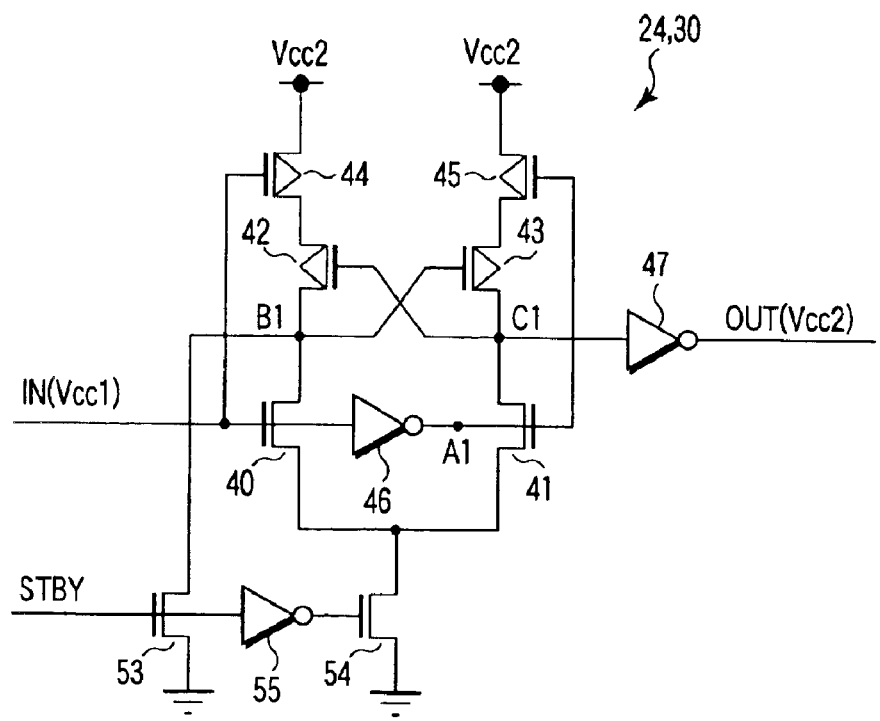
FIG. 9 is a circuit diagram of a level shift circuit provided in a flash memory according to a third embodiment of the present invention.

Next, a semiconductor memory device according to a third embodiment of the present invention will be explained. The third embodiment is such that the source of the level shift circuit is disconnected from the ground potential when it is not in operation. Since the third embodiment has the same configuration as that of the first embodiment except for the level shift circuit, its explanation will be omitted. FIG. 9 is a circuit diagram of each of the level shift circuits 24, 30 provided in a flash memory according to the third embodiment.

As shown in the figure, each of the level shift circuits 24, 30 of the third embodiment is such that n-channel MOS transistors 53, 54 and an inverter 55 are provided in the configuration of FIG. 3 explained in the first embodiment. The n-channel MOS transistor 53 has its source connected to the ground potential and its drain connected to node B1. A standby signal STBY is input to the gate of the n-channel MOS transistor 53. The n-channel MOS transistor 54 has its source connected to the ground potential and its drain connected to the sources of the n-channel MOS transistors 40, 41. A standby signal /STBY inverted by the inverter 55 is input to the gate of the n-channel MOS transistor 54. When the level shift circuit is in operation, the standby signal is set low (or negated). When the level shift circuit is not in operation (in the standby state), the standby signal is set high (or asserted).

In the level shift circuit configured as described above, since the standby signal STBY is brought into the low level in the operating state, the n-channel MOS transistor 53 is turned off and the n-channel MOS transistor 54 is turned on. Therefore, the operation is as explained in the first embodiment. On the other hand, when the level shift circuit is not in operation, the standby signal STBY is brought into the high level. As a result, the n-channel MOS transistor 53 is turned on and the n-channel MOS transistor 54 is turned off. This brings node B1 into the ground potential and the sources of the n-channel MOS transistors 40, 41 into the floating state.

Of course, this configuration may be applied to the level shift circuit 34 in the voltage converting circuit 19.

The flash memory of the third embodiment produces not only the effect in item (1) explained in the first embodiment but also the effect in the following item.

(3) The power consumption of the flash memory is decreased.

As shown in FIG. 9, in each of the level shift circuit 24, 30, 34 provided in the flash memory of the third embodiment, the n-channel MOS transistor 54 is connected between the sources of the n-channel MOS transistors 40, 41 and the ground potential. In the standby state, the n-channel MOS transistor 54 is in the off state, which disconnects the source of the n-channel MOS transistor 54 from the ground potential. That is, there is no current path from the power supply potential Vcc2 to the ground potential in each of the level shift circuits 24, 30, 34. Therefore, in the standby state, the flowing of extra current through the level shift circuit is suppressed and the power consumption of the level shift circuit is decreased, which contributes to power saving in the flash memory.

Figure 10:
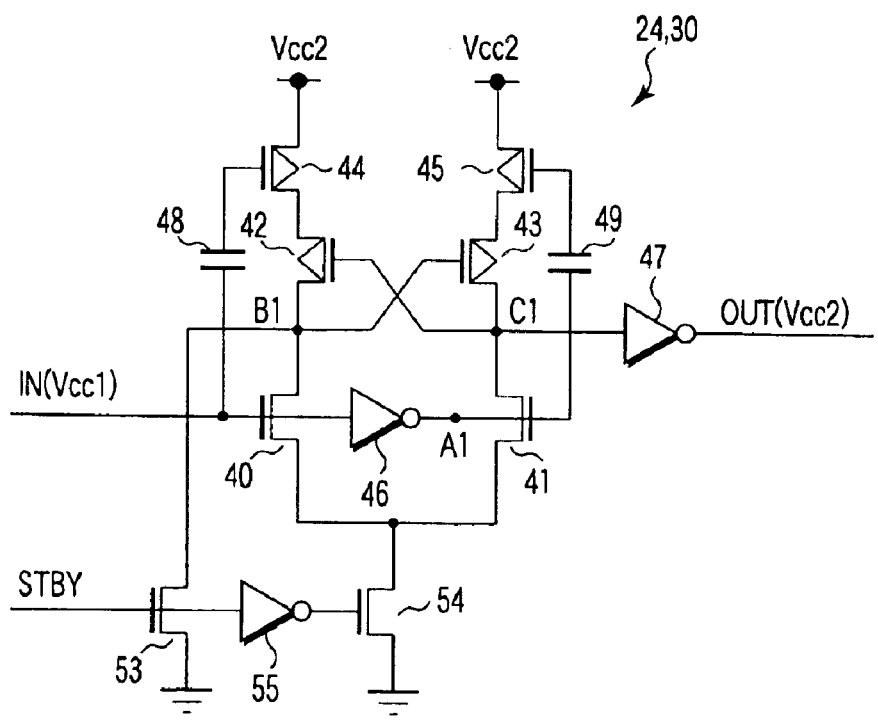
FIG. 10 is a circuit diagram of a level shift circuit provided in a flash memory according to a first modification of the third embodiment.

FIG. 10 is a circuit diagram of a level shift circuit provided in a flash memory according to a first modification of the third embodiment. This modification is such that the third embodiment is applied to the level shift circuit explained in the second embodiment. Specifically, in the configuration of FIG. 7 explained in the third embodiment, n-channel MOS transistors 53, 54 and an inverter 55 are provided. The first modification also produces the effects in item (1) and item (3).

FIG. 11 is a circuit diagram of a level shift circuit provided in a flash memory according to a second modification of the third embodiment. This modification is such that the third embodiment is applied to the modification of the second embodiment. Specifically, in the configuration of FIG. 8 explained in the modification of the third embodiment, n-channel MOS transistors 53, 54 and an inverter 55 are provided. The second modification also produces the effects in item (1), item (2) and item (3).

In this modification, a clocked inverter 56 is connected between the input node of the inverter 51 and the gate of the MOS transistor 44 and a clocked inverter 57 is connected between the input node of the inverter 52 and the gate of the MOS transistor 45 as shown in FIG. 11.

FIG. 12 is a circuit diagram of each of the clocked inverters 56, 57. As shown in the figure, each of the clocked inverters 56, 57 has two p-channel MOS transistors 90, 91 and two n-channel MOS transistors 92, 93. The p-channel MOS transistor 90 has its source connected to the power supply potential Vcc1 and its gate connected to the input node IN2 of the clocked inverter. The p-channel MOS transistor 91 has its source connected to the drain of the p-channel MOS transistor 90 and its drain connected to the output node OUT2 of the clocked inverter. An inverted standby signal /STBY is input to the gate of the p-channel MOS transistor 91. The n-channel MOS transistor 92 has its source connected to the output node OUT2. A standby signal STBY is input to the gate of the n-channel MOS transistor 92. The n-channel MOS transistor 93 has its source connected to the source of the n-channel MOS transistor 92, its drain connected to the ground potential, and its gate connected to the input node IN2.

With the above configuration, the standby signal STBY is a signal for initializing the potential at one electrode of each of the capacitors 48, 49 of the level shift circuit as described earlier. The standby signal STBY is basically made high at the time when the power supply is turned on or when the signal remains unchanged for a long time as in the sleep mode.

When the standby signal STBY is at the high level, the clocked inverters 56, 57 permit the signal to pass. Then, when the input signal IN is at the low level, the MOS transistors 90 to 92 of the clocked inverter 56 turn on, bringing one electrode of the capacitor element 48 into the high level (Vcc1). As a result, the potential difference between the electrodes of the capacitor 48 is kept at Vcc1. In addition, in the clocked inverter 57, the MOS transistors 91 to 93 turn on, bringing one electrode of the capacitor 49 into the low level (0V). As a result, the potential difference between the electrodes of the capacitor 49 is also kept at Vcc1.

On the other hand, when the input signal IN is at the high level, one electrode of the capacitor element 48 is at the low (0V), with the result that the potential difference between the electrodes of the capacitor 48 is kept at Vcc1. In addition, one electrode of the capacitor element 49 is at the high level (Vcc1), with the result that the potential difference between the electrodes of the capacitor 49 is kept at Vcc1.

In this state, when the level shift circuit goes into the operating state and the standby signal STBY is made low, the clocked inverters 56, 57 go into the idle state. Then, when the input signal IN is input, the potential of each of the p-channel MOS transistors 44, 45 is boosted in the range from −Vcc1 to 2·Vcc1.

As described above, the potential difference between the electrodes of each of the capacitor elements 48, 49 is fixed in the idle state, which improves the reliability in the operation of the level shift circuit.

As described above, with the semiconductor memory devices according to the first to third embodiments, in the level shift circuit which has two current paths and obtains a voltage (at node C1) by causing current to flow through the other current path (the path from Vcc2 to the source of the n-channel MOS transistor 41 in FIG. 3) on the basis of the potential (at node B1) of one current path (the path from Vcc2 to the source of the n-channel MOS transistor 40 in FIG. 3), when the input signal is asserted, one current path is disconnected from the power supply potential Vcc2 and then connected to the ground potential. Thus, the potential (at node B1) of one current path is determined quickly. As a result, the potential (at node C1) of the other current path is also determined quickly. Then, the row address decode signal and column address decode signal are input to the level shift circuit configured as described above, which converts the voltage level and supplies the resulting signal to the bit lines, the select gate lines, and word lines. As a result, the operating speed of the flash memory is improved.

Figure 13:
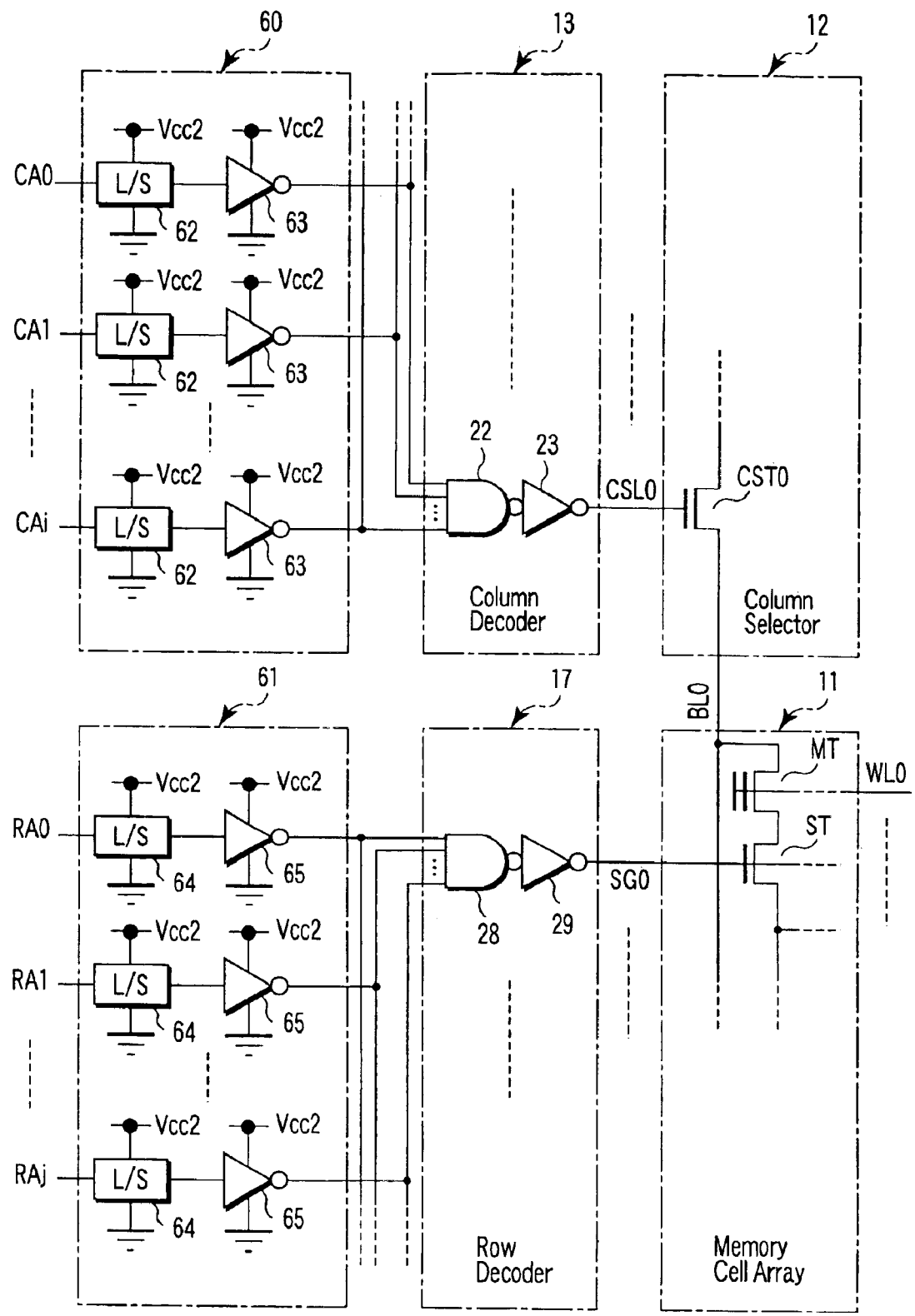
FIG. 13 is a circuit diagram of a row decoder and a column decoder provided in a flash memory according to a first modification of each of the first to third embodiments.

In the first to third embodiments, after the column decoder 13 and second row decoder 17 decode the column address signal CA0 to CAi and row address signal RA0 to RAj, the resulting voltage level is changed from Vcc1 into Vcc2. As with the first row decoder 16, the voltage level of the column address signal CA0 to CAi and row address signal RA0 to RAj may be first changed from Vcc1 to Vcc2. FIG. 13 is a circuit diagram of the column decoder 13 and second row decoder 17 in a flash memory according to a first modification of each of the first to third embodiments.

As shown in the FIG. 13, the configuration of the column decoder 13 and second row decoder 17 is almost the same as that of the column address decode circuit 20 and row address decode circuit 26 explained in FIG. 2. The column decoder 13 and second row decoder 17 operate on the power supply voltage Vcc2. The column decoder 13 decodes (i+1)-bit column address signal CA0 to CAi, thereby producing a column address decode signal. The column address decode signal is supplied to the column select lines CSL0 to CSLn.

The potential of the column address signal input to the column decoder 13 and the potential of the row address signal input to the second row decoder 17 have been changed from the Vcc1 level to the Vcc2 level. The voltage converting circuits 60, 61 convert the column address signal CA0 to CAi and row address signal RA0 to RAj. The voltage converting circuits 60, 61, which operate on the power supply voltage Vcc2, convert the column address signal CA0 to CAi and row address signal RA0 to RAj of the Vcc1 level into those of the Vcc2 level. The voltage converting circuit 60 has a level shift circuit 62 and an inverter 63 provided for each bit ((i+1) bit) CA0 to CAi in the column address signal. The level shift circuit 62 changes the voltage level of the column address signal from the Vcc1 level to the Vcc2 level. The inverter 63 inverts the output of the level shift circuit 62. Then, the output of the inverter 63 is supplied to the column decoder 13. The voltage converting circuit 61 has a level shift circuit 64 and an inverter 65 provided for each bit ((j+1) bit) RA0 to RAj in the row address signal. The level shift circuit 64 changes the voltage level of the row address signal from the Vcc1 level to the Vcc2 level. The inverter 65 inverts the output of the level shift circuit 64. Then, the output of the inverter 65 is supplied to the second row decoder 17.

As described above, the column decoder 13 and second row decoder 17 first change the voltage level of the column row address signal and row address signal from the Vcc1 level to the Vcc2 level. Thereafter, they may decode the column address signal and row address signal of the Vcc2 level.

Furthermore, in the memory cell array of the flash memory according to each of the first to third embodiments, a hierarchical bit line method may be used. FIG. 14 is a block diagram of a flash memory according to a second modification of each of the first to third embodiments.

As shown in the figure, the memory cell array 11 has (m+1)×(n+1) memory cell blocks BLK (where m and n are natural numbers) and a selector SEL and a MOS transistors 66. A selector SEL is provided for each of the memory cell blocks. Although FIG. 14 shows only (2×2) memory cell blocks BLK, the number of memory cell blocks is not limited to this.

Each of the memory cell blocks includes (4×2) memory cells MC. The number of memory cells MC arranged in the column direction is four in FIG. 1. The number is illustrative, not restrictive, and may be, for example, 8 or 16. Then, the drain regions of the memory cell transistors MT of two columns of memory cells are connected to two local bit lines LBL0, LBL1, respectively. One end of each of the local bit lines LBL0, LBL1 is connected to a selector SEL. The other ends of the local bit lines LBL0, LBL1 are connected to the first row decoder 16 via the current paths of the MOS transistors 71.

Next, the configuration of the selector SEL will be explained. Each of the selectors SEL has four MOS transistors 67 to 70 connected in series. Specifically, one end of the MOS transistor 67 is connected to one end of the current path of the MOS transistor 68. The other end of the current path of the MOS transistor 68 is connected to one end of the current path of MOS transistor 69. The other end of the current path of the MOS transistor 69 is connected to one end of the current path of the MOS transistor 70. The gates of the MOS transistors 67, 70 are connected to the first row decoder 16. The gates of the MOS transistors 68, 69 are connected to the column decoder 13. The local bit line LBL0 for the corresponding memory cell block BLK is connected to the junction node of the MOS transistor 67 and the MOS transistor 68. The local bit line LBL1 for the corresponding memory cell block BLK is connected to the junction node of the MOS transistor 69 and the MOS transistor 70. The other end of each of the MOS transistors 67, 70 of the selector SEL is connected to any one of the write global bit lines WGBL0 to WGBL(2n−1). Each of the write global bit lines WGBL0 to WGBL(2n−1) connects commonly the other ends of the current paths of the MOS transistors 67 or MOS transistors 70 of the selectors SEL in the same column. One end of each of the write global bit lines WGBL0 to WGBL(2n−1) is connected to a write circuit 15 provided for each of the write global bit lines. A junction node of the MOS transistor 68 and the MOS transistor 69 is connected to any one of the read global bit lines RGBL0 to RGBL(n−1). Each of the read global bit lines RGBL0 to RGBL(n−1) connects commonly the junction nodes of the MOS transistors 68 and the MOS transistors 69 of the selectors SEL in the same column. One end of each of the read global bit lines RGBL0 to RGBL(n−1) is connected to the sense amplifier 14 via the current path of the corresponding MOS transistor 66. The gates of the individual MOS transistors 66 are connected in common. The common gate is then connected to the first row decoder 16.

The first row decoder 16 selects any one of the word lines WL0 to WL(4m−1) and applies a voltage to the selected word line, in a write operation. The first row decoder 16 further applies a voltage to the gates of the MOS transistors 67, 70 of the selector SEL. Moreover, the first row decoder 16 applies a voltage to the gate of the MOS transistor 71 and the common junction node of the local bit lines.

The column decoder 13 selects one of the MOS transistors 68, 69 in the selector SEL and applies a voltage to the gate of the selected MOS transistor, in a read operation.

As described above, use of the hierarchical bit line system improves the operating speed of the flash memory. The configuration explained in each of the first to third embodiments may be applied to the column decoder 13 and the first and second row decoders 16, 17 in the hierarchical bit line system.

Figure 15:
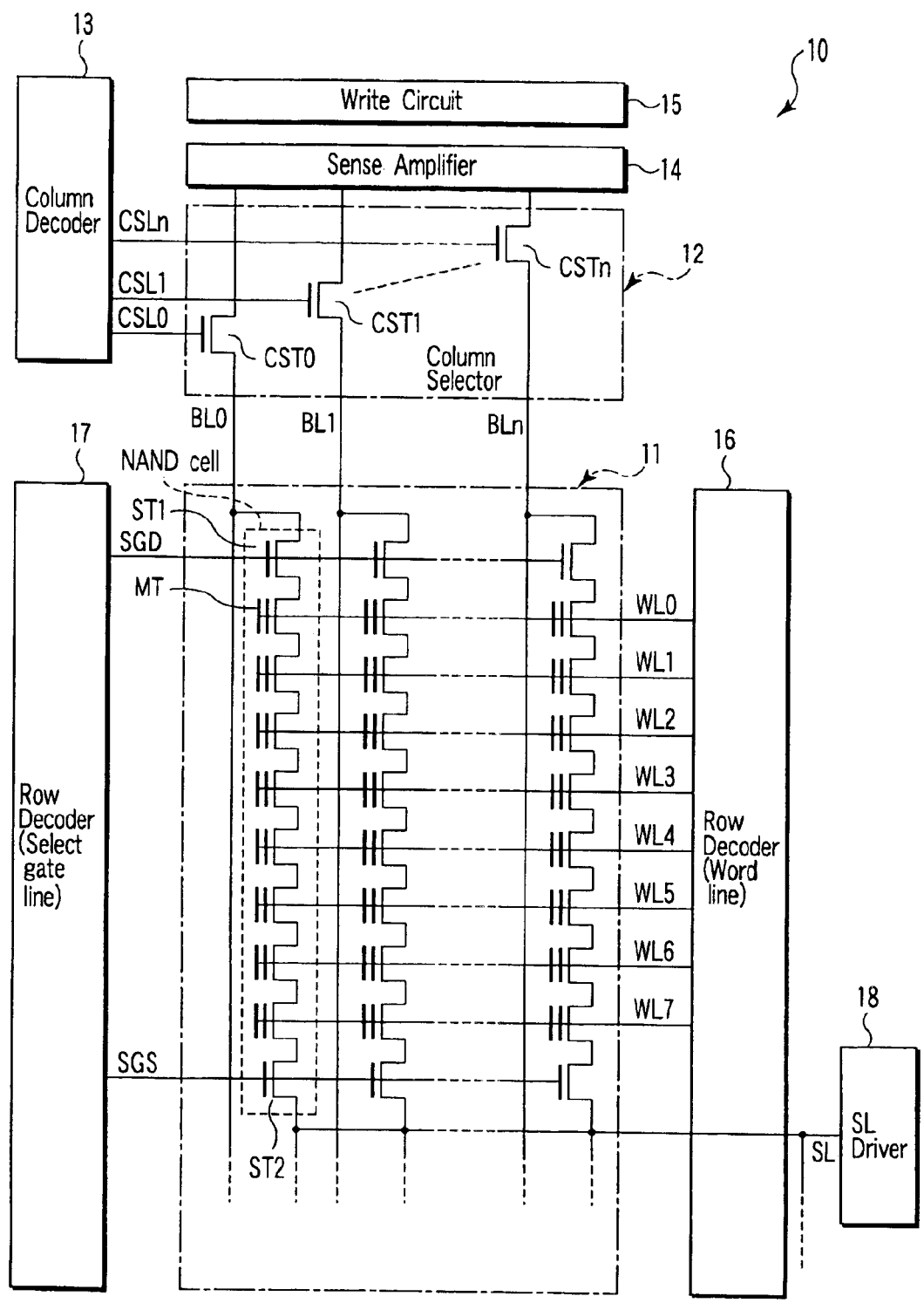

In the first to third embodiments, the flash memory with memory cells, each including a select transistor ST and a memory cell transistor MT, has been taken as an example. The embodiments may be applied to a NAND flash memory. FIG. 15 is a block diagram of a flash memory according to a third modification of each of the first to third embodiments. FIG. 15 shows a NAND flash memory.

As shown in FIG. 15, the memory cell 11 has a plurality of NAND cells. A NAND cell has two select transistors ST1, ST2 and a plurality of memory cell transistors MT. While in FIG. 15, the number of memory cell transistors is eight, the number is not restrictive and may be 16 or 32. A plurality of memory cell transistors MT are connected in series between the source of the select transistor ST1 and the drain of the select transistor ST2. The drain regions of the select transistors in the same column are connected commonly to a bit line. The source regions of the select transistors ST2 are connected commonly to a source line. The memory cell transistor MT and select transistors ST1, ST2 each have a stacked gate formed on a semiconductor substrate with the a gate insulating film interposed therebetween. The stacked gate includes a floating gate formed on the gate insulating film and a control gate formed on the floating gate with an inter-gate insulating film interposed therebetween. In the memory cell transistor MT, the floating gates are isolated on a transistor basis. In the select transistors ST1, ST2, the control gates adjacent to each other in the word line direction are connected in common. Moreover, in the select transistors ST1, ST2, the floating gate and control gate are connected to each other electrically. The control gates of the memory cell transistors MT in the same row are connected commonly to a word line. The control gates of the select transistors ST1 in the same row are connected commonly to a select gate line SGD. The control gates of the select transistors ST2 in the same row are connected commonly to a select gate line SGS. The remaining configuration is the same as that of each of the first to third embodiments.

The first to third embodiments may be applied even to the NAND flash memory. Specifically, the level shift circuit included in each of the column decoder 13 and the first and second row decoders 16, 17 may be configured as shown in FIGS. 3 and 7 and FIGS. 9 to 11.

Furthermore, the first to third embodiments may be applied to a flash memory having memory cells, each including two select transistors ST1, ST2 and one memory cell transistor MT. FIG. 16 is a block diagram of a flash memory according to a fourth modification of each of the first to third embodiments.

As shown in FIG. 16, the memory cell array 11 has a plurality of memory cells MC arranged in a matrix. A memory cell has two select transistors ST1, ST2, and a memory cell transistor MT. These three transistors are connected in series in such a manner that the memory cell transistor MT is sandwiched between the two select transistors ST1, ST2. The drain regions of the select transistors ST1 in the same column are connected commonly to a bit line. The source regions of the select transistors ST2 in the same column are connected commonly to a source line. Each of the memory cell transistors MT and select transistors ST1, ST2 has a stacked gate formed on the semiconductor substrate with a gate insulating film interposed therebetween. The stacked gate includes a floating gate formed on the gate insulating film and a control gate formed on the floating gate with an inter-gate insulating film interposed therebetween. In the memory cell transistors MT, the floating gates are isolated from one another on a transistor basis. In the select transistors ST1, ST2, the floating gates adjacent to each other in the word line direction are connected in common. Furthermore, in the select transistors ST1, ST2, the floating gate and the control gate are connected electrically. The control gates of the memory cell transistors MT in the same row are connected commonly to a word line. The control gates of the select transistors ST1 in the same row are connected commonly to a select gate line SGD. The control gates of the select transistors ST2 in the same row are connected commonly to a select gate line SGS. The remaining configuration is the same as that of each of the first to third embodiments.

The first to third embodiments may be applied even to the above flash memory. Specifically, the level shift circuit included in each of the column decoder 13 and the first and second row decoders 16, 17 may be configured as shown in FIGS. 3 and 7 and FIGS. 9 to 11.

Figure 17:
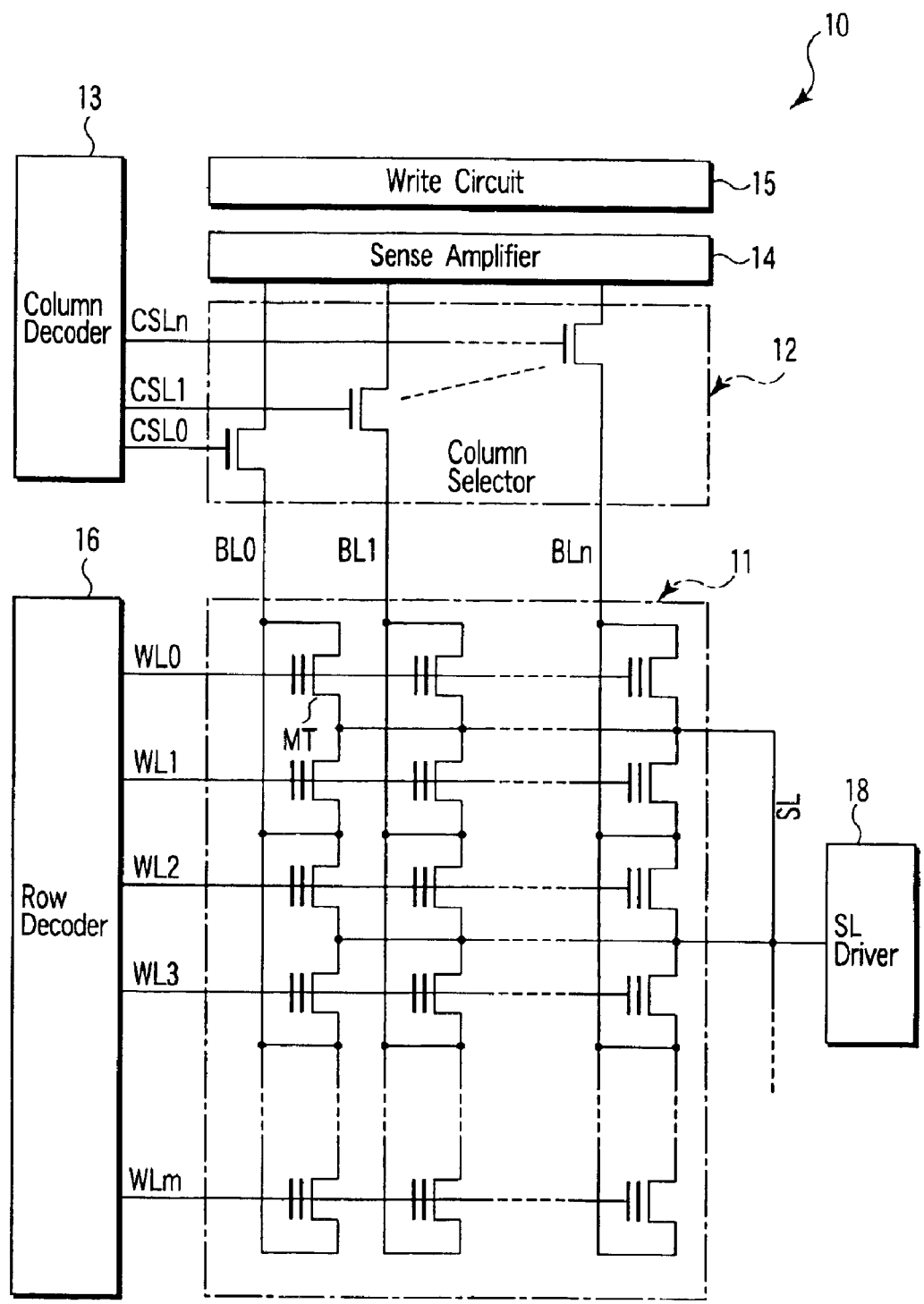

Furthermore, the first to third embodiments may be applied to a NOR flash memory. FIG. 17 is a block diagram of a flash memory according to a fifth modification of each of the first to third embodiments. FIG. 17 shows a NOR flash memory.

As shown in FIG. 17, the memory cell array 11 has a plurality of memory cell transistors MT arranged in a matrix. A memory cell transistor MT has a stacked gate formed on the semiconductor substrate with a gate insulating film interposed therebetween. The stacked gate includes a floating gate formed on the gate insulating film and a control gate formed on the floating gate with an inter-gate insulating film interposed therebetween. The floating gates are isolated from one another on a transistor basis. The drain regions of the memory cell transistors MT in the same column are connected commonly to a bit line. The control gates of the memory cell transistors MT in the same row are connected commonly to a word line. The source regions of the memory cell transistors MT are connected commonly to a source line. The remaining configuration is almost the same as that of each of the first to third embodiments.

The first to third embodiments may be applied even to the above NOR flash memory. Specifically, the level shift circuit included in each of the column decoder 13 and the first row decoder 16 may be configured as shown in FIGS. 3 and 7 and FIGS. 9 to 11.

Figure 18:
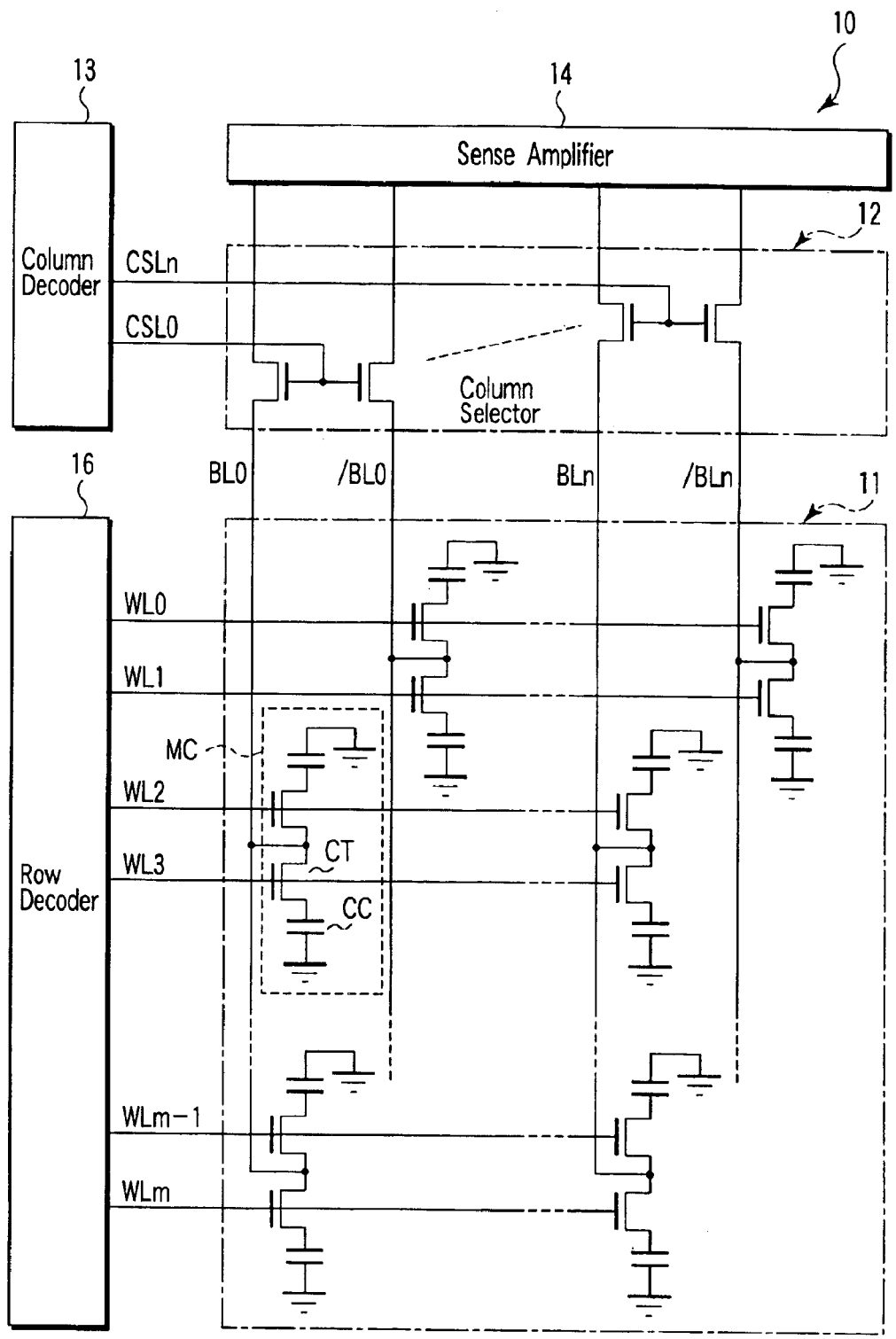
FIG. 18 is a block diagram of a DRAM according to a sixth modification of each of the first to third embodiments.

Furthermore, the first to third embodiments may be applied to not only a flash memory but also, for example, DRAM (Dynamic Random Access Memory). FIG. 18 is a block diagram of a semiconductor memory device according to a sixth modification of each of the first to third embodiments. FIG. 18 shows a DRAM.

As shown in FIG. 18, the memory cell array 11 has a plurality of memory cells MC arranged in a stagger pattern. A memory cell MC includes a cell transistor CT and a cell capacitor CC. The capacitor CC has one electrode grounded and the other electrode connected to the source of the cell transistor CT. The gates of the cell transistors CT in the same row are connected commonly to a word line. The remaining configuration is almost the same as that of each of the first to third embodiments.

The first to third embodiments may be applied even to the above DRAM. Specifically, the level shift circuit included in each of the column decoder 13 and the first row decoder 16 may be configured as shown in FIGS. 3 and 7 and FIGS. 9 to 11.

Figure 19:
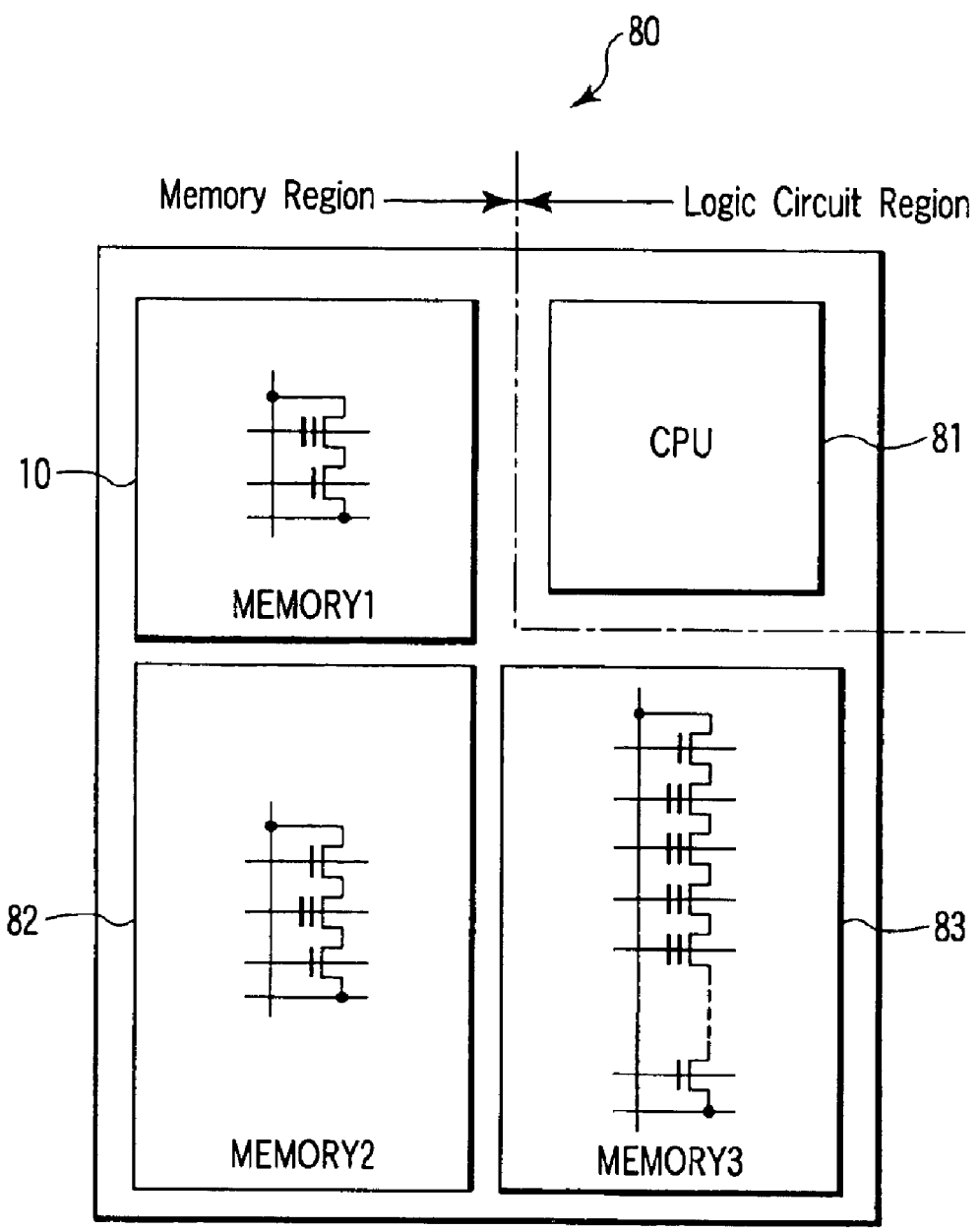
FIG. 19 is a block diagram of a system LSI including a flash memory according to a seventh modification of each of the first to third embodiments.

Furthermore, the first to third embodiments may be applied to a system LSI. FIG. 19 is a block diagram of a system LSI according to a seventh modification of each of the first to third embodiments.

As shown in FIG. 19, a system LSI 180 has a logic circuit region and a memory region. In the logic circuit region, for example, a CPU 81 is provided. In the memory region, there are provided a flash memory 10 explained in the first to third embodiments, a flash memory 82 including three MOS transistors explained in FIG. 16, and a NAND flash memory 83 explained in FIG. 15. In the flash memory 10, since the number of transistors connected in series in a memory cell is two, the memory cells of this type have a larger current driving capability than those of other types. Thus, the flash memory 10 is suitable for high-speed reading. When being embedded on the same chip as the CPU 81 as shown in FIG. 19, the flash memory 10 can be used as a ROM that stores the firmware for the CPU 81. Since the operating speed of the flash memory 10 is high, this makes it possible for the CPU 81 to read the data directly without the intervention of RAM or the like, which improves the operating speed of the system LSI. Moreover, the flash memory 10 can be formed in the same manufacturing processes as the flash memory 82 and the NAND flash memory 83. For instance, the process of implanting ions to form an impurity diffused layer, the process of patterning gate electrodes and metal wiring layers, and the like can be carried out at the same time for three types of flash memories. In this case, for example, the impurity diffused layers have the same concentration in the individual memories. Since three flash memories provided in an LSI are formed in the same processes, the manufacture of LSIs can be simplified.

For example, in the logic circuit region, the CPU 81 may be formed on an SOI substrate and, in the memory region, the individual memories 10, 82, 83 may be formed on a bulk silicon substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array which has memory cells arranged in a matrix, each memory cell having a first MOS transistor with a stacked gate including a first semiconductor layer and a second semiconductor layer formed on the first semiconductor layer with an inter-gate insulating film interposed therebetween;
   bit lines each of which connects one end of the current path of each of the first MOS transistors in the same column in common electrically;
   first word lines each of which connects the second semiconductor layers of the first MOS transistors in the same row in common;
   a column selector which selects any one of the bit lines;
   a column decoder which controls the column selector; and
   a first row decoder which selects any one of the first word lines, at least one of the column decoder and the first row decoder including a level shift circuit which includes:
   a second and a third MOS transistor each of which has one end of its current path connected electrically to a power supply potential;
   a fourth MOS transistor which has a gate receiving an input signal related to an address signal, one end of its current path connected to the other end of the current path of the second MOS transistor and to the gate of the third MOS transistor, and the other end of its current path connected electrically to the ground potential;
   a fifth MOS transistor which has a gate receiving the inverted signal of the input signal, one end of its current path connected to the other end of the current path of the third MOS transistor, to the gate of the second MOS transistor and to the bit line or the first word line electrically, and the other end of its current path connected electrically to the ground potential; and
   a first switch element which controls the supply of the power supply potential to the second and third MOS transistors in response to the input signal.

2. The semiconductor memory device according to claim 1, wherein the first switch element includes:
   a sixth MOS transistor which has one end of its current path connected to the power supply potential, the other end of its current path connected to the one end of the current path of the second MOS transistor, and a gate receiving the input signal; and
   a seventh MOS transistor which has one end of its current path connected to the power supply potential, the other end of its current path connected to the one end of the current path of the third MOS transistor, and a gate receiving the inverted signal of the input signal.

3. The semiconductor memory device according to claim 1, wherein the level shift circuit further includes:
   a first capacitor element which has one electrode input the input signal; and
   a second capacitor element which has one electrode input the inverted signal of the input signal, and
   the first switch element controls the supply of the power supply potential to the second and third MOS transistors according to the potential at the other electrodes of the first and second capacitor elements.

4. The semiconductor memory device according to claim 3, wherein the first switch element includes:
   a sixth MOS transistor which has one end of its current path connected to the power supply potential, the other end of its current path connected to the one end of the current path of the second MOS transistor, and a gate connected to the other electrode of the first capacitor element; and
   a seventh MOS transistor which has one end of its current path connected to the power supply potential, the other end of its current path connected to the one end of the current path of the third MOS transistor, and a gate connected to the other electrode of the second capacitor element.

5. The semiconductor memory device according to claim 1, wherein the level shift circuit further includes:
   a second switch element which connects the other ends of the current paths of the fourth and fifth MOS transistors to the ground potential, when an enable signal to bring the level shift circuit into the operating state is asserted; and
   a third switch element which connects the one end of the current path of the fourth MOS transistor to the ground potential, when the enable signal is negated.

6. The semiconductor memory device according to claim 1, wherein the first switch element breaks a connection between the second MOS transistor and the power supply potential and makes a connection between the third MOS transistor and the power supply potential, when the input signal brings the fourth and fifth MOS transistors into the on state and the off state, respectively.

7. The semiconductor memory device according to claim 1, wherein
at least one of the column decoder and the first row decoder further includes a decoder circuit which decodes the address signal to obtain an address decode signal of a first voltage level,
the input signal input to the level shift circuit is the address decode signal, and
the level shift circuit converts the address decode signal into a second voltage level different from the first voltage level.

8. The semiconductor memory device according to claim 1, wherein
the input signal input to the level shift circuit is the address signal of a first voltage level,
the level shift circuit converts the address signal into a second voltage level different from the first voltage level, and
at least one of the column decoder and the first row decoder further includes a decoder circuit which decodes the address signal converted into the second voltage level to obtain an address decode signal.

9. The semiconductor memory device according to claim 1, wherein
each of the memory cells further includes an eighth MOS transistor which has a stacked gate including a third semiconductor layer and a fourth semiconductor layer formed on the third semiconductor layer with the inter-gate insulating film interposed therebetween and one end of its current path connected to the one end of the current path of the first MOS transistor,
the semiconductor memory device further comprises:
a source line which connects the other ends of the current paths of the first MOS transistors in common;
second word lines each of which connects the fourth semiconductor layers of the eighth MOS transistors of the memory cells in the same row in common; and
a second row decoder which selects any one of the second word lines,
the bit lines are connected to the other ends of the current paths of the corresponding eighth MOS transistors, and
the first and second semiconductor layers of each of the first MOS transistors are connected to each other electrically.

10. The semiconductor memory device according to claim 1, wherein
each of the memory cells further includes:
an eighth MOS transistor which has a stacked gate including a third semiconductor layer and a fourth semiconductor layer formed on the third semiconductor layer with the inter-gate insulating film interposed therebetween and one end of its current path connected to the one end of the current path of the first MOS transistor; and
a ninth MOS transistor which has a stacked gate including a fifth semiconductor layer and a sixth semiconductor layer formed on the fifth semiconductor layer with the inter-gate insulating film interposed therebetween and one end of its current path connected to the other end of the current path of the eighth MOS transistor,
the semiconductor memory device further comprises:
a source line which connects the other ends of the current paths of the first MOS transistors in common;
second word lines each of which connects the fourth semiconductor layers of the eighth MOS transistors of the memory cells in the same row in common;
third word lines each of which connects the sixth semiconductor layers of the ninth MOS transistors of the memory cells in the same row in common; and
a second row decoder which selects any one of the second word lines,
the first row decoder further selects any one of the third word lines,
the bit lines are connected to the other ends of the current paths of the corresponding ninth MOS transistors,
the first and second semiconductor layers of each of the first MOS transistors are connected to each other electrically, and
the fifth and sixth semiconductor layers of each of the ninth MOS transistors are connected to each other electrically.

11. The semiconductor memory device according to claim 1, wherein
each of the memory cells further includes:
an eighth MOS transistor which has a stacked gate including a third semiconductor layer and a fourth semiconductor layer formed on the third semiconductor layer with the inter-gate insulating film interposed therebetween; and
a plurality of ninth MOS transistors which are connected in series between one end of the current path of the first MOS transistor and one end of the current path of the eighth MOS transistor and each of which has a stacked gate including a fifth semiconductor layer and a sixth semiconductor layer formed on the fifth semiconductor layer with the inter-gate insulating film interposed therebetween,
the semiconductor memory device further comprises:
a source line which connects the other ends of the current paths of the first MOS transistors in common;
second word lines each of which connects the fourth semiconductor layers of the eighth MOS transistors in the same row in common;
third word lines each of which connects the sixth semiconductor layers of the ninth MOS transistors in the same row in common; and
a second row decoder which selects any one of the third word lines,
the first row decoder further selects any one of the third word lines,
the bit lines are connected to the other ends of the current paths of the corresponding eighth MOS transistors,
the first and second semiconductor layers of each of the first MOS transistors are connected to each other electrically, and
the third and fourth semiconductor layers of each of the eighth MOS transistors are connected to each other electrically.

* * * * *